(12) United States Patent
Friedman et al.

(10) Patent No.: US 8,678,734 B2
(45) Date of Patent: Mar. 25, 2014

(54) ELEVATOR-BASED TOOL LOADING AND BUFFERING SYSTEM

(75) Inventors: Gerald M. Friedman, New Ipswich, NH (US); Michael L. Bufano, Belmont, MA (US); Christopher Hofmeister, Hampstead, NH (US); Ulysses Gilchrist, Reading, MA (US); William Fosnight, Carlisle, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 196 days.

(21) Appl. No.: 12/897,440

(22) Filed: Oct. 4, 2010

(65) Prior Publication Data

US 2011/0142575 A1 Jun. 16, 2011

Related U.S. Application Data

(63) Continuation of application No. 11/210,918, filed on Aug. 23, 2005, now Pat. No. 7,806,643.

(60) Provisional application No. 60/604,099, filed on Aug. 23, 2004.

(51) Int. Cl.
*B65G 54/02* (2006.01)
*B65G 54/00* (2006.01)
*H01L 21/67* (2006.01)
*H01L 21/677* (2006.01)

(52) U.S. Cl.
USPC ...... 414/222.01; 414/279; 414/591; 414/940; 198/465.2

(58) Field of Classification Search
USPC ......... 414/277–282, 217, 217.1, 940, 222.01, 414/222.13; 104/127; 901/21
See application file for complete search history.

(56) References Cited

U.S. PATENT DOCUMENTS 2,693,770 A 11/1954 Hubscher
4,465,174 A 8/1984 Uhl
(Continued)

FOREIGN PATENT DOCUMENTS

EP 1202325 5/2005
JP 10045213 2/1998
(Continued)

OTHER PUBLICATIONS

Campbell, "Overhead Intrabay Automation and Microstocking—a virtual fab case study," IEEE/SEMI Advance Dsemiconductor Manufacturing Conference, pp. 368-372 (1997).

(Continued)

*Primary Examiner* — Gregory Adams
(74) *Attorney, Agent, or Firm* — Perman & Green, LLP; Colin C. Durham

(57) ABSTRACT

A substrate processing apparatus is provided. The apparatus has a casing, a low port interface and a carrier holding station. The casing has processing devices within for processing substrates. The load port interface is connected to the casing for loading substrates into the processing device. The carrier holding station is connected to the casing. The carrier holding station is adapted for holding at least one substrate transport carrier so the at least one substrate transport carrier is capable of being coupled to the load port interface without lifting the at least one substrate transport carrier off the carrier holding station. The carrier holding station is arranged to provide a substantially simultaneous swap section for substantially simultaneous replacement of the substrate transport carrier from the carrier holding station.

5 Claims, 34 Drawing Sheets

(56) References Cited

U.S. PATENT DOCUMENTS

| | | | |
|---|---|---|---|
| 4,724,874 A | 2/1988 | Parikh et al. | |
| 4,995,430 A | 2/1991 | Bonora et al. | |
| 5,032,053 A | 7/1991 | Krieg | |
| 5,097,421 A | 3/1992 | Maney et al. | |
| 5,164,905 A * | 11/1992 | Iwasaki et al. | 700/112 |
| 5,228,820 A * | 7/1993 | Stansfield et al. | 414/278 |
| 5,319,845 A * | 6/1994 | Watanabe et al. | 29/701 |
| 5,370,491 A | 12/1994 | Bonora et al. | |
| 5,399,531 A * | 3/1995 | Wu | 700/112 |
| 5,551,348 A * | 9/1996 | Matsumoto | 104/88.02 |
| 5,611,452 A | 3/1997 | Bonora et al. | |
| 5,927,926 A | 7/1999 | Yagi et al. | |
| 5,957,648 A * | 9/1999 | Bachrach | 414/217 |
| 5,980,183 A | 11/1999 | Fosnight | |
| 5,988,233 A | 11/1999 | Fosnight et al. | |
| 6,068,437 A | 5/2000 | Boje et al. | |
| 6,079,927 A | 6/2000 | Muka | |
| 6,113,341 A | 9/2000 | Fukushima | |
| 6,129,496 A | 10/2000 | Iwasaki et al. | |
| 6,183,184 B1 | 2/2001 | Shiwaku | |
| 6,283,692 B1 | 9/2001 | Perlov et al. | |
| 6,336,546 B1 * | 1/2002 | Lorenz | 198/346.2 |
| 6,354,781 B1 | 3/2002 | Pan | |
| 6,435,330 B1 * | 8/2002 | Bonora et al. | 198/346.3 |
| 6,438,623 B1 | 8/2002 | Ryan | |
| 6,453,574 B1 | 9/2002 | Chen | |
| 6,457,928 B1 | 10/2002 | Ryan | |
| 6,506,009 B1 | 1/2003 | Nulman et al. | |
| 6,517,304 B1 | 2/2003 | Matsumoto | |
| 6,572,321 B1 | 6/2003 | Nulman | |
| 6,579,052 B1 | 6/2003 | Bonora et al. | |
| 6,591,961 B2 * | 7/2003 | Fukushima | 198/346.2 |
| 6,604,624 B2 | 8/2003 | Hirata et al. | |
| 6,641,350 B2 | 11/2003 | Nakashima et al. | |
| 6,677,690 B2 * | 1/2004 | Fosnight et al. | 307/326 |
| 6,681,916 B2 | 1/2004 | Hiroki | |
| 6,695,120 B1 | 2/2004 | Trammell | |
| 6,726,429 B2 | 4/2004 | Sackett et al. | |
| 6,745,102 B1 | 6/2004 | Liu | |
| 6,881,020 B2 | 4/2005 | Chang et al. | |
| 2003/0156928 A1 | 8/2003 | Sackett et al. | |
| 2003/0198540 A1 | 10/2003 | Lin et al. | |
| 2004/0091338 A1 * | 5/2004 | Kim | 414/217 |
| 2004/0149672 A1 | 8/2004 | Motoori et al. | |
| 2004/0181929 A1 * | 9/2004 | Mariano et al. | 29/469 |

FOREIGN PATENT DOCUMENTS

| | | |
|---|---|---|
| JP | 2000053237 | 2/2000 |
| JP | 2000289975 | 10/2000 |
| JP | 2001031216 | 6/2001 |
| WO | WO0037338 | 6/2000 |
| WO | WO0113408 | 2/2001 |
| WO | WO0196884 | 12/2001 |

OTHER PUBLICATIONS

Kaempf, "Automated Wafer Transport in the Wafer Fab", IEEE/SEMI Advanced Semiconductor Manufacturing Conference, pp. 356-361 (1997).

Kuo, "Modelling and Performance Evlaluation of an Overhead Hoist Transport System in a 300 mm Fabrication Plant," Int. J. Adv. Manuf. Technol., vol. 20, pp. 153-161 (2002).

Sikich, "Development and Implementation of an Automated Wafer Transport System", IEEE/SEMI Advanced Semiconductor Manufacturing Conference, pp. 400-404 (1998).

* cited by examiner

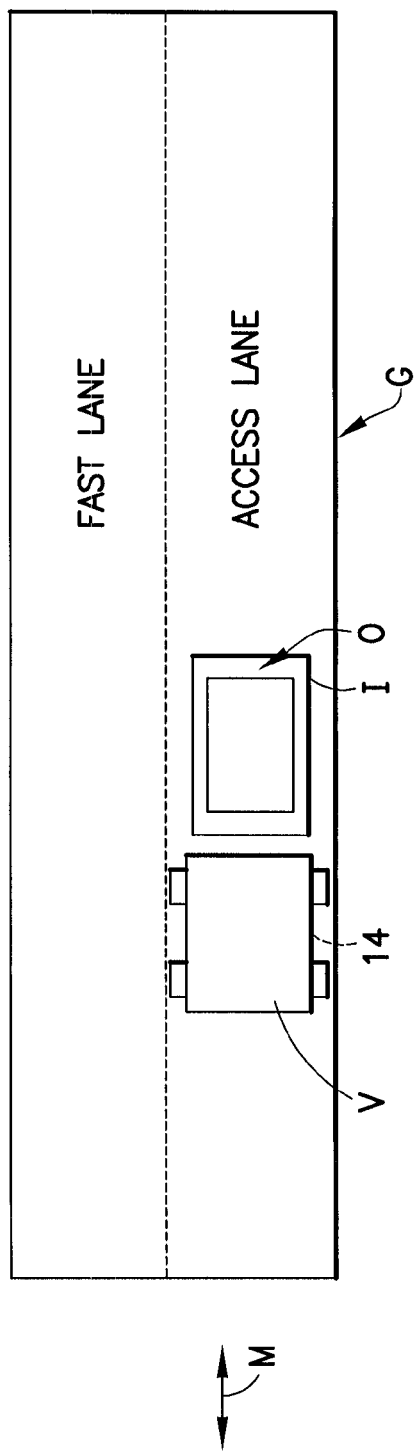

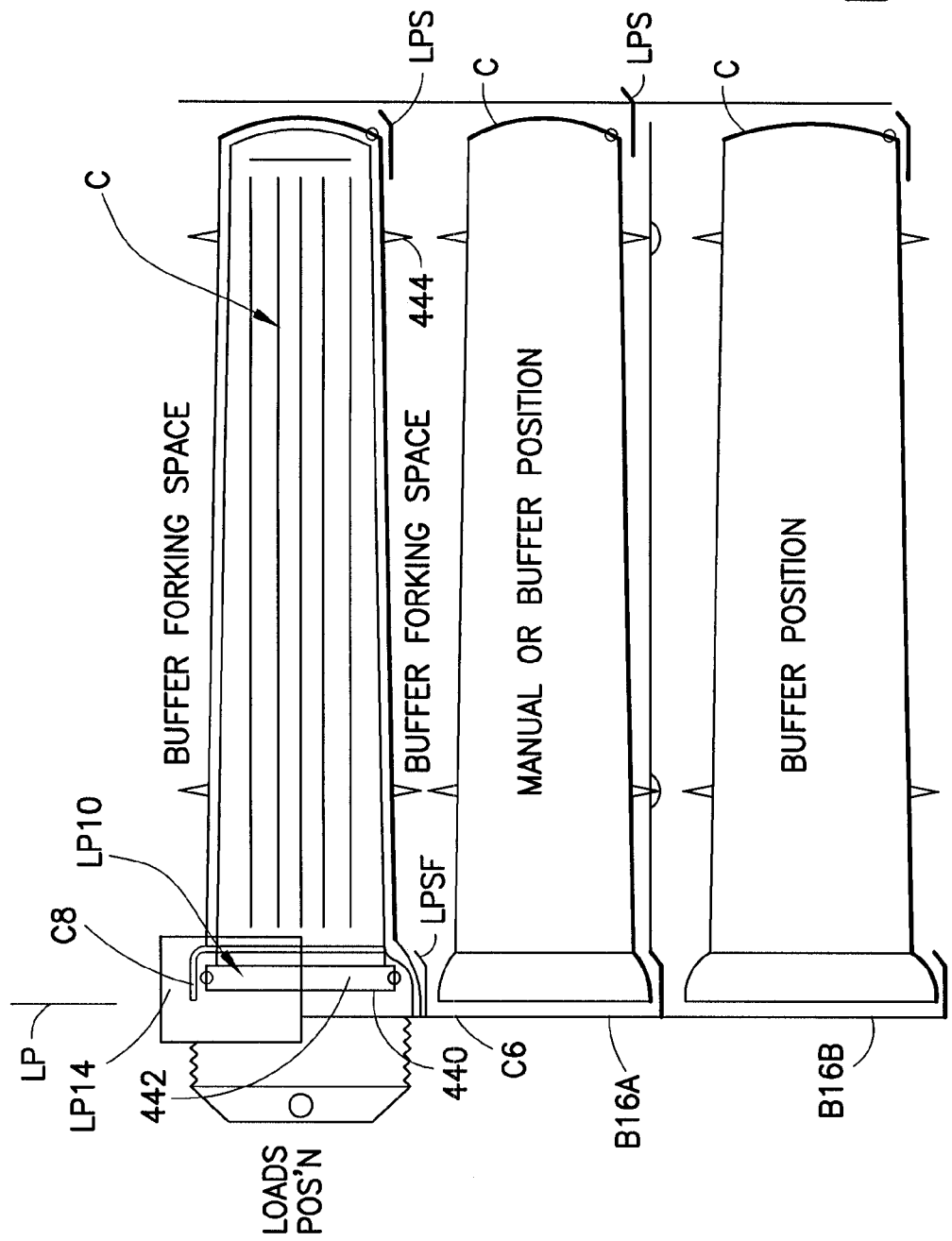

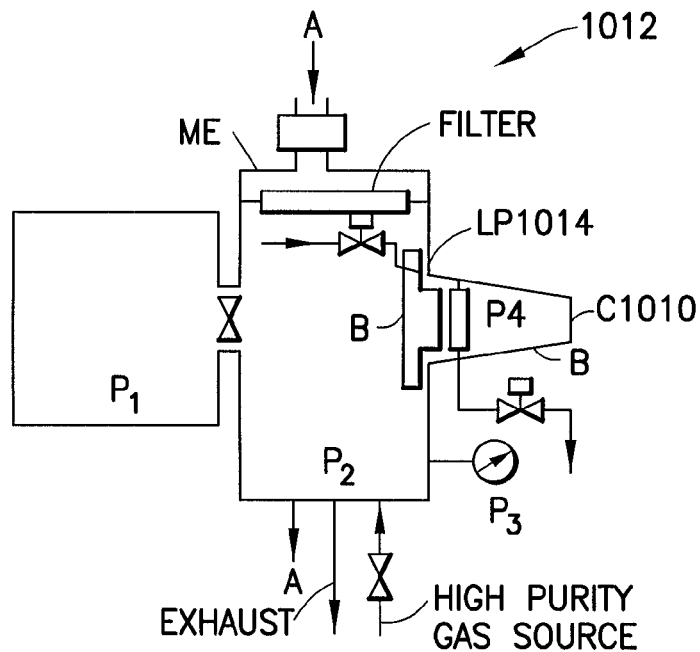
FIG.18
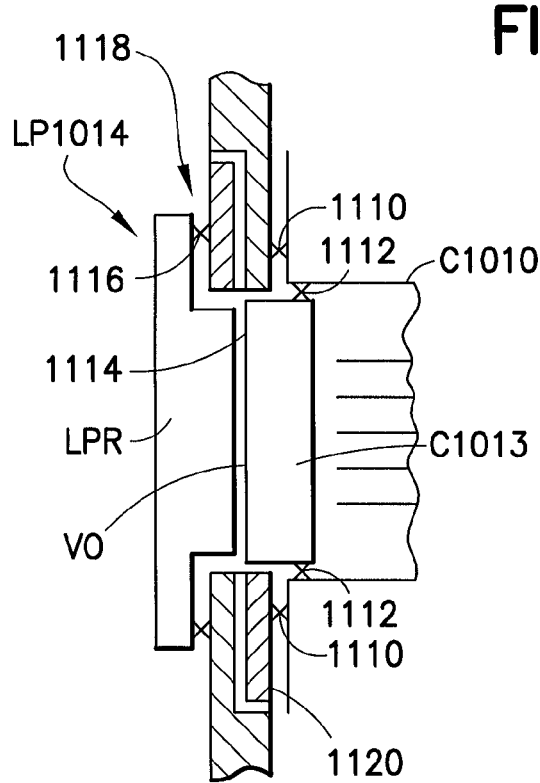
FIG.18A
FIG.18B

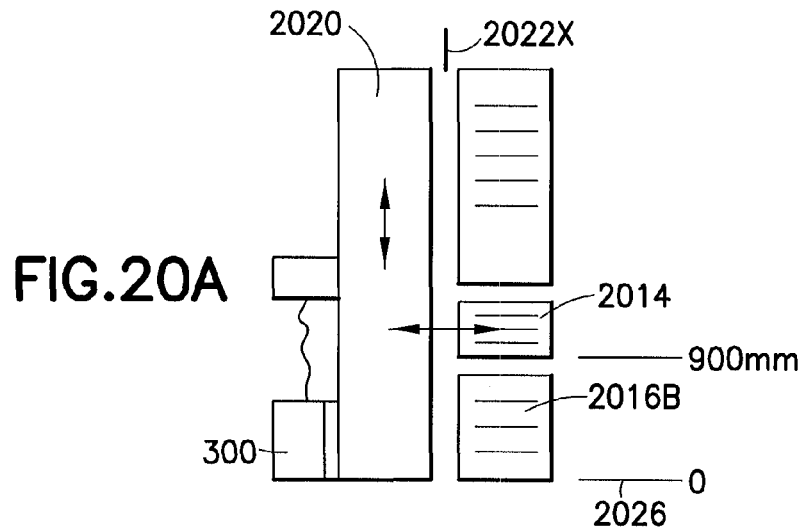
FIG.20A
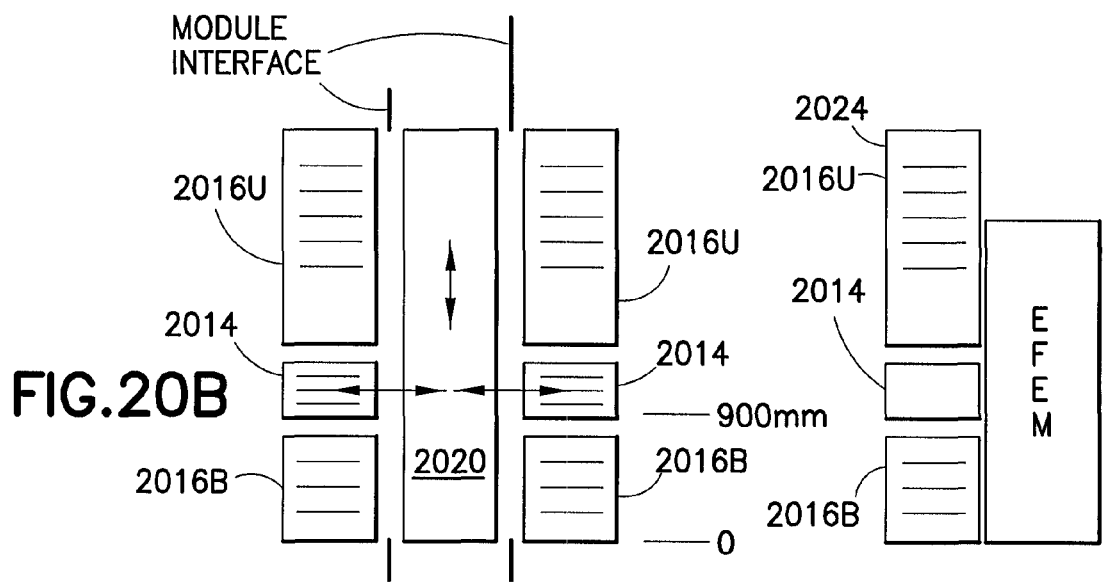
FIG.20B
FIG.20D
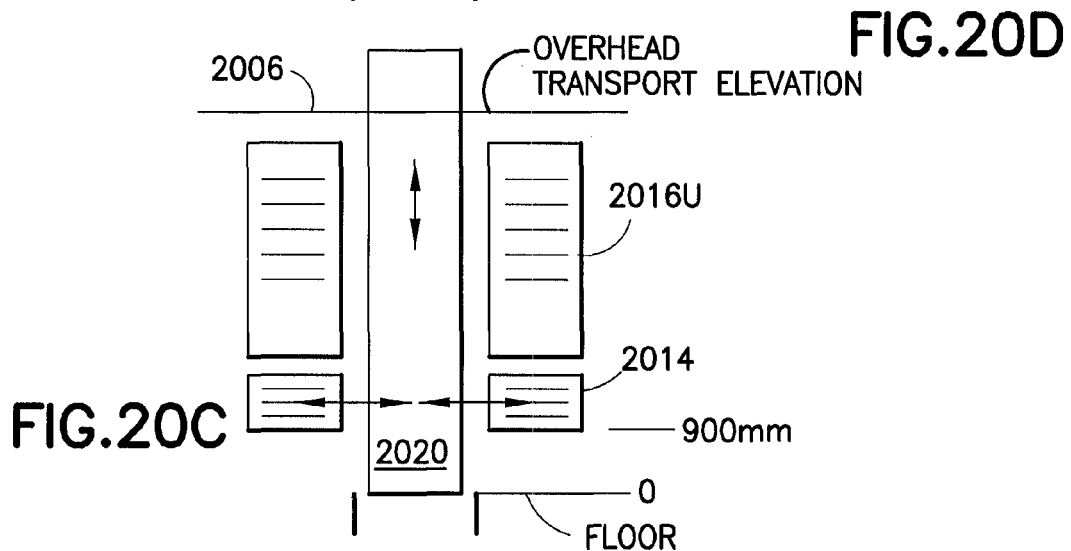
FIG.20C

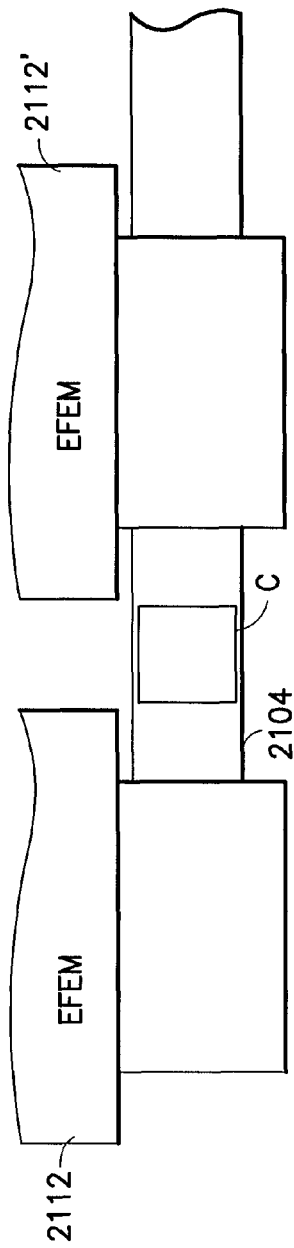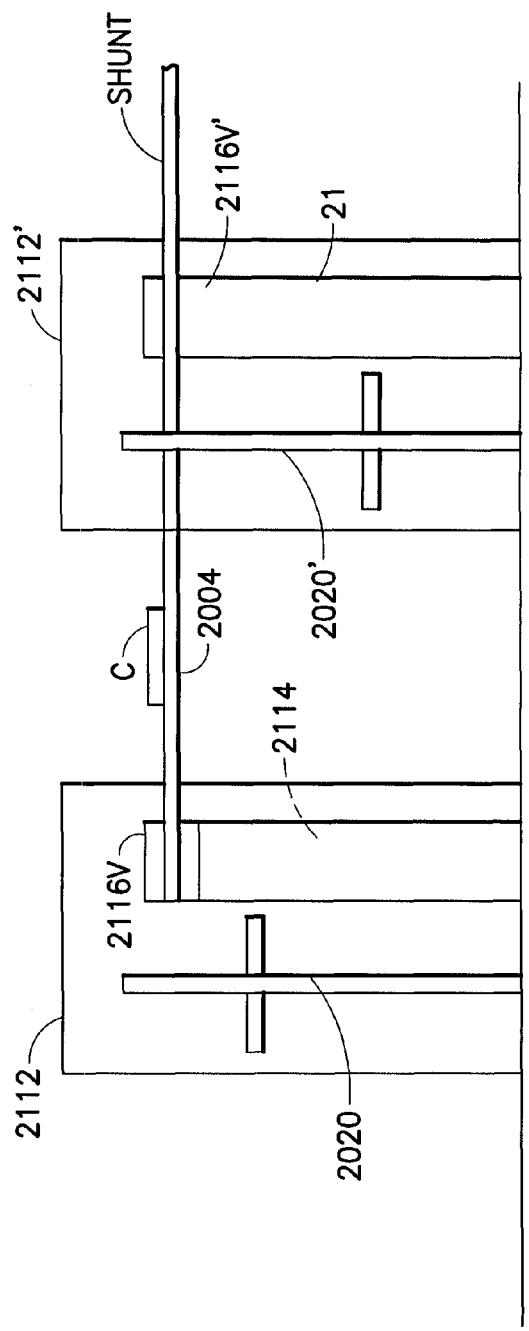

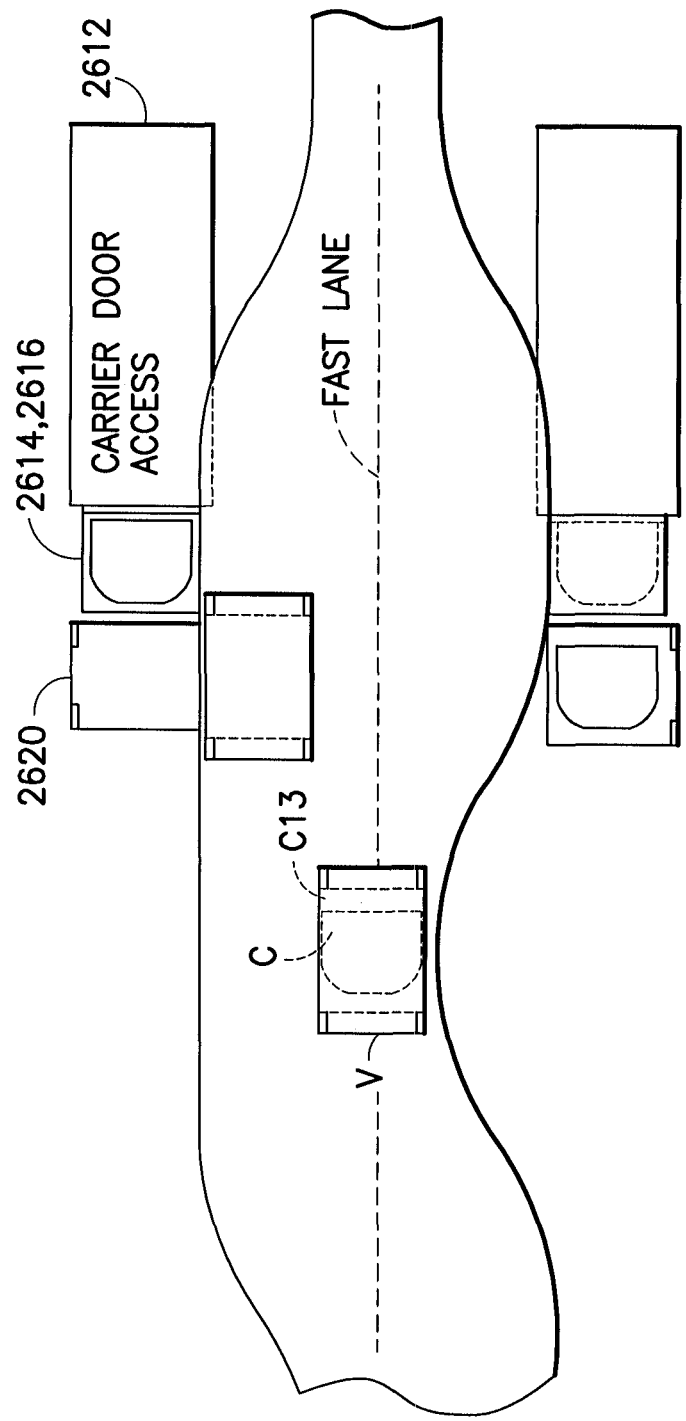

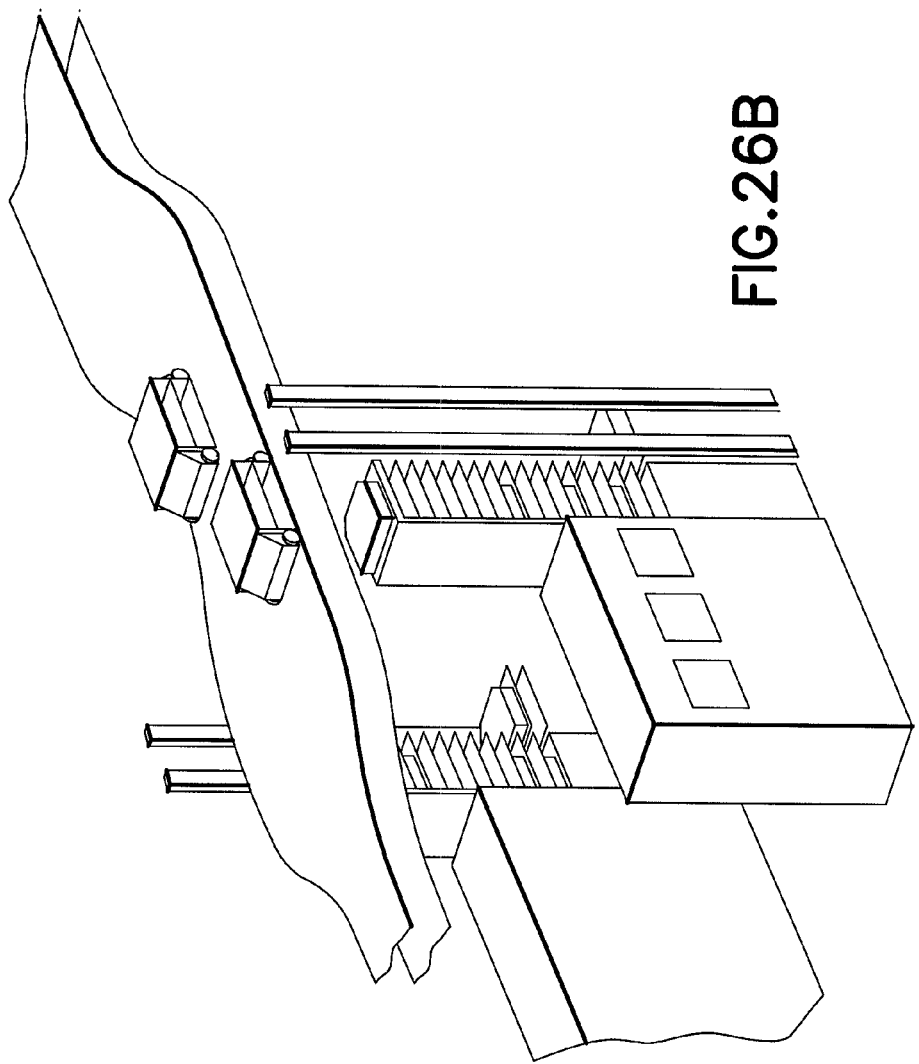

ELEVATOR-BASED TOOL LOADING AND BUFFERING SYSTEM

CROSS-REFERENCE TO RELATED APPLICATION(S)

This application is a continuation of U.S. application Ser. No. 11/210,918, filed on Aug. 23, 2005, now U.S. Pat. No. 7,806,643, issued on Oct. 5, 2010, which claims the benefit of U.S. Provisional Application No. 60/604,099 filed Aug. 23, 2004 which are incorporated by reference herein in their entirety.

BACKGROUND

1. Field of the Invention

The exemplary embodiments disclosed herein are related to an apparatus and method for transporting and storing reduced-capacity substrate carriers for use within an IC fab.

2. Brief Description of Related Developments

There is a desire in the semiconductor industry to reduce wafer cycle time through the fab and reduce the amount of work in progress as well as to improve wafer safety. Studies have shown that by moving to a single wafer carrier, wafer cycle time and WIP (wafers in process) is significantly reduced. In addition for the next generation wafer size (450 mm) the ITRS roadmap calls for single substrate carriers. Benefits of using single wafer or reduced capacity carriers include WIP reduction, process changeover time reduction and product ramp time improvement. Problems arise where single substrate carriers are employed relative to the ability of both the process tool and material transport system to effectively maintain the higher pace of the factory due to the larger number of carrier transport moves as compared to 13 or 25 wafer carriers. One example of such a problem includes where there is only one slot. It is desired that the robot in the process tool have the capability to quickly swap (fast swap) the wafer in the carrier so the carrier may be able to be replaced with another carrier that has an unprocessed wafer to keep the tool busy. Many such tools do not have the ability to fast swap, as in the case of a conventional single blade three axis robot. Another example of such a problem includes where there is only one slot. It is desired that the material transport system transporting carrier to tools in the IC FAB have the capability to supply carriers, at a high rate and quickly swap the carriers at the process tools load port(s) so that one carrier at the tool may be able to be replaced with another carrier that has an unprocessed wafer to keep the tool busy. Many such material transport systems do not have the ability to supply carriers at a high rate or with the capability to fast swap, as in the case of a conventional (overhead transport) OHT based material transport systems as implemented in conventional 300 mm fabs.

Conversely conventional load ports, or carrier to tool interfaces, of conventional processing tools are not capable of handling (i.e. receiving, interfacing or reading for removal) a high rate supply of carriers desired when employing reduced capacity carriers in the FAB. One example of a conventional carrier to tool interface is disclosed in U.S. Patent Publication US 2003/0044261, published Mar. 6, 2003, wherein the semiconductor material handling system is an EFEM that may be mounted or integrated to the front end of a processing tool. The conventional EFEM disclosed has carrier (FOUP) I/O ports and pod advance plates corresponding to the I/O ports that register and shuttle pods for docking/undocking to the I/O ports. The above noted example is representative of conventional carrier-tool interfaces of conventional processing tools. The I/O ports to which the pods are mated (for loading/unloading substrates or wafers to the tool) are linearly or axially distributed. By way of example, for each unit width (corresponding to the carrier width) along the carrier-tool interface frontage there is but one I/O port. Hence, in conventional tools but a single carrier is interfaced per unit width of the tool front. This linear interface geometry is very limiting to tool load unload when the carriers being used are of reduced capacity. Further, the employment of pod advance plates for pod docking to I/O ports, in the conventional interfaces, typically involves pod registry along two planes (i.e. seating interface between pod and advance plate and port interface between pod and port), a condition which is over-constrained by its very nature with a corresponding deleterious affect on the rate of carrier supply to the tool. Also, the time involved in first registering a pod to the pod advance plate, and then having the pod advance plate bring the pod into contact/registry with the I/O port again impacts on the achievable rate of carrier supply. These are but some of the problems of conventional carrier-tool interfaces overcome by the exemplary embodiments as will be described in greater detail below.

Other examples of transport systems, carriers and openers may be found in U.S. Pat. No. 6,047,812; RE38,221 E; U.S. Pat. Nos. 6,461,094; 6,520,338; 6,726,429; 5,980,183; United States Patent Publications 2004/0062633, 2004/0081546, 2004/0081545; 2004/0076496 and pending Brooks Automation application Ser. Nos. 10/682,808 all of which are incorporated by reference herein in their entirety.

SUMMARY OF THE EXEMPLARY EMBODIMENTS

In accordance with an exemplary embodiment a substrate processing apparatus is provided. The apparatus has a casing, a low port interface and a carrier holding station. The casing has processing devices within for processing substrates. The load port interface is connected to the casing for loading substrates into the processing device. The carrier holding station is connected to the casing. The carrier holding station is disposed at the load port interface and is adapted for holding at least one substrate transport carrier so that the at least one substrate carrier held by the carrier holding station is capable of being coupled to the load port interface without lifting the at least one substrate transport carrier off the carrier holding station. The carrier holding station is arranged to provide a substantially simultaneous swap section for substantially simultaneous replacement of the at least one substrate transport carrier from the carrier holding station.

In accordance with another exemplary embodiment, a substrate processing apparatus is provided. The apparatus has a casing, a load port interface, a carrier holding station, and a carrier loading and buffering system. The casing has a processing device within for processing substrates. The load port interface is connected to the casing for loading substrates into the processing device. The carrier holding station is connected to the casing. The carrier holding station is adapted for holding at least one substrate transport carrier at the load port interface. The carrier loading and buffering system communicates with the carrier holding station for loading and unloading the substrate transport carrier from the holding station. The carrier loading and buffering system interfaces with a first carrier transport system capable of moving the substrate transport carrier from the substrate processing apparatus to another substrate processing apparatus along a first transport path. The carrier loading and buffering system also having a second carrier transport system capable of moving the substrate transport carrier to the other substrate processing apparatus along a second transport path.

In accordance with another exemplary embodiment, a substrate processing apparatus is provided. The apparatus has a casing, a load port interface, and a carrier holding station. The casing has a processing device within for processing substrates. The load port interface is connected to the casing for loading substrates into the processing device. The load port interface has a number of stacked openings, each opening defining a corresponding substrate transport path through the opening and having a number of movable closure for blocking the corresponding substrate transport path. The carrier holding station is connected to the casing. The carrier holding station is adapted for holding at least one substrate transport carrier at the load port interface for loading and unloading substrates. Each closure is independently movable relative to each other from a blocked position, in which the closure blocks the corresponding substrate transport path, to an unblocked position in which the corresponding substrate transport path is not blocked by the closure and the number of stacked openings collectively have a size that corresponds to a load port opening for a twenty five substrate side opening transport carrier.

BRIEF DESCRIPTION OF THE DRAWINGS

The foregoing aspects and other features of the present invention are explained in the following description, taken in connection with the accompanying drawings, wherein:

FIGS. 1-1A are respectively schematic elevation and plan views of a substrate processing system incorporating features in accordance with an exemplary embodiment;

FIGS. 8A-8B are respectively schematic elevation and plan views of a load port section of the processing system and substrate carriers in accordance with another exemplary embodiment;

FIG. 18 is a schematic elevation view of a processing tool and carrier of the processing system;

FIG. 18A is a partial cross-sectional view of a load port section and carrier shown in FIG. 18, and FIG. 18B is a schematic representation of a single four way sealing interface between the carrier, carrier door, load port door and load port frame of the processing tool and carrier in FIG. 18;

FIGS. 20A-20C are schematic elevation views of a processing tool interface section with buffer and load port modules in different configuration as seen from one direction and FIG. 20D is another schematic elevation of the processing tool interface section, buffer and load port modules as seen from another direction;

FIGS. 21A-21B are schematic plan and elevation views of processing tools and a carrier transport system in accordance with another exemplary embodiment;

FIGS. 26A-26B are schematic plan and perspective views of processing tools, transport systems, carriers and carrier vehicles according to another exemplary embodiment;

DETAILED DESCRIPTION OF THE EXEMPLARY EMBODIMENTS

Figure 1:
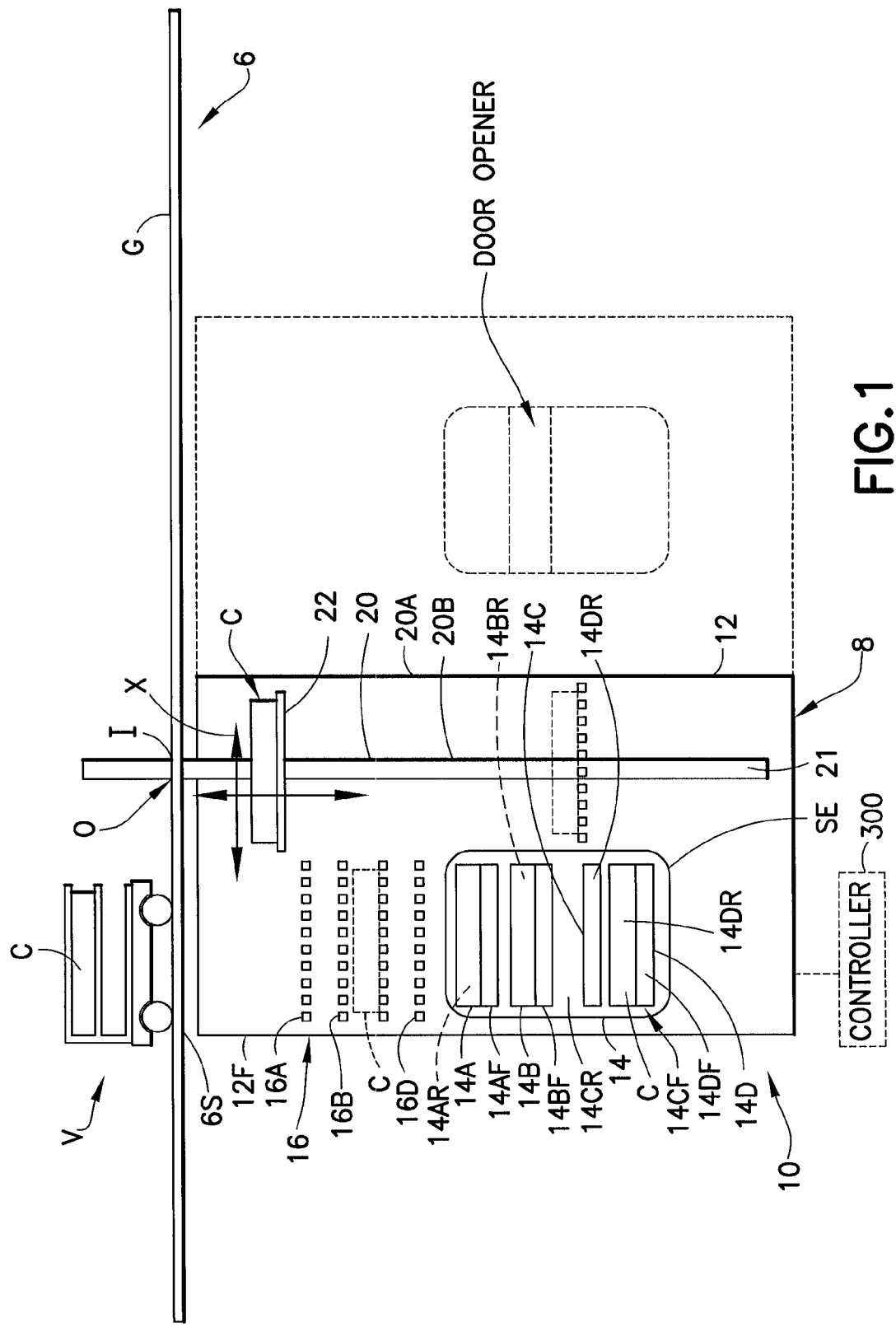

Referring to FIGS. 1-1A, schematic elevation and plan views of a substrate processing system incorporating features of the disclosed embodiments, located in a fabrication facility or FAB are illustrated. Although the embodiments disclosed will be described with reference to the embodiments shown in the drawings, it should be understood that the embodiments disclosed can be embodied in many alternate forms of embodiments. In addition, any suitable size, shape or type of elements or materials could be used.

The substrate processing system 10 in the exemplary embodiment shown in FIGS. 1-1A is representative of any suitable processing system and generally comprises processing tools 12 (one is shown for example purposes) transport system 6 and controller 300 (see also FIGS. 25A-25B and 26A-26B respectively plan and perspective views of substrate processing systems arranged in a FAB in accordance with other exemplary embodiments). The transport system 6 links the processing tools 12 in the FAB. The transport system 6 links the processing tools 12 in the FAB. The transport system 6 is capable of transporting substrate carriers C between the processing tools 12. The processing tool 12 may have a loading/unloading interface 14 and buffer station 16. The loading/unloading interface 14 holds carriers for loading/unloading substrates in the processing tool. The buffer station 16 provides a carrier buffer for carriers in transit between the loading/unloading station 14 and transport system 6. A handling system 8 moves carrier between processing tool and transport system 6. The controller 300 is connected to the processing tool 12, loading/unloading interface 14, handling system 8 and transport system 6. The handling system 8 handles substrate carriers C in the vicinity of a process tool 12 such that the carriers containing unprocessed wafers may be retrieved from a transportation system 6 and either moved directly to the loading/unloading interface 14 or optionally stored in the local queuing buffer 16. The loading sequence is reversed to transition processed substrates back to the transportation system 6. The interface between loading/unloading interface 14 or buffer 16 and handling system 8 allows a "fast swap" of carriers C by shuttling the carriers to and from adjacent loading 14A-14D, or storage positions 16A-16D simultaneously, or in rapid succession as will be described in greater detail below. The handling system may allow any desired number of carrier transport systems to interface with the processing tool 12. The loading/unloading interface 14 of the process tool 12 is capable of interfacing independently with each of multiple stacked carriers as will also be described in further detail below.

Figure 2A:
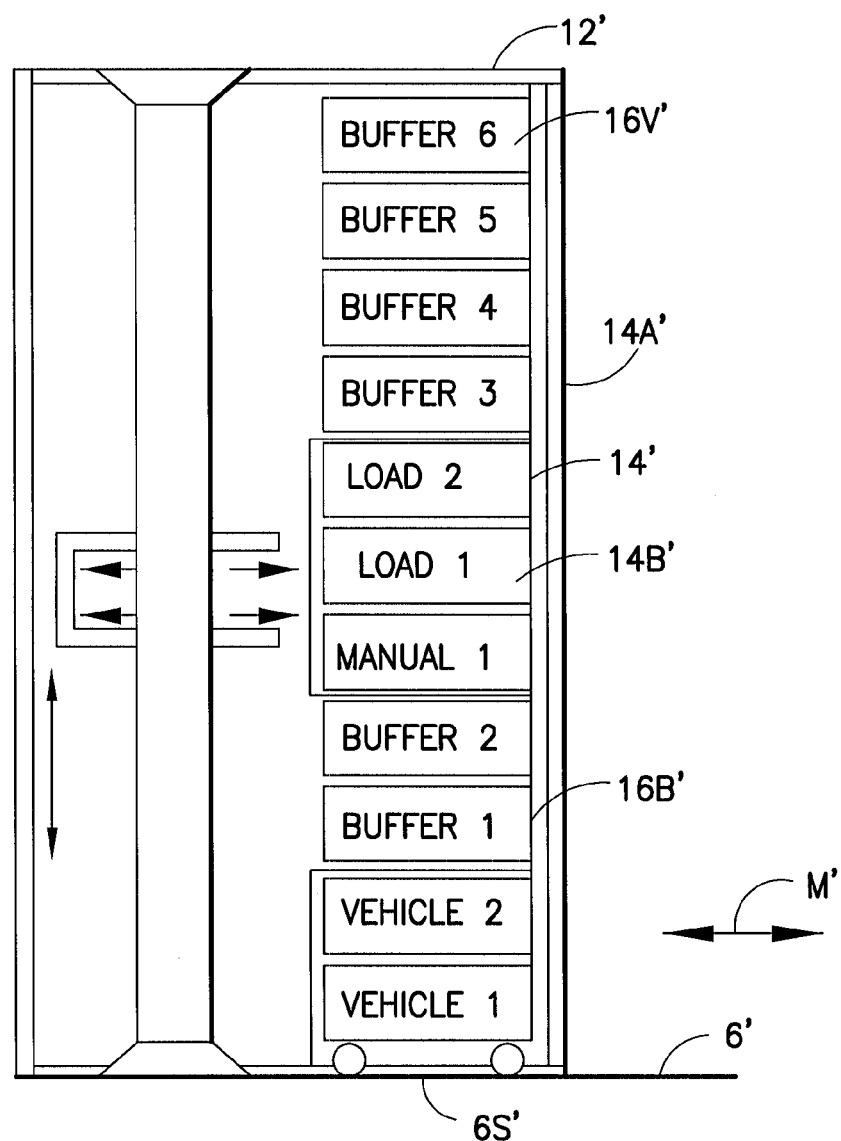
FIGS. 2A-2B are respectively schematic front and side elevation views of a substrate processing system in accordance with another exemplary embodiment.
Figure 2B:
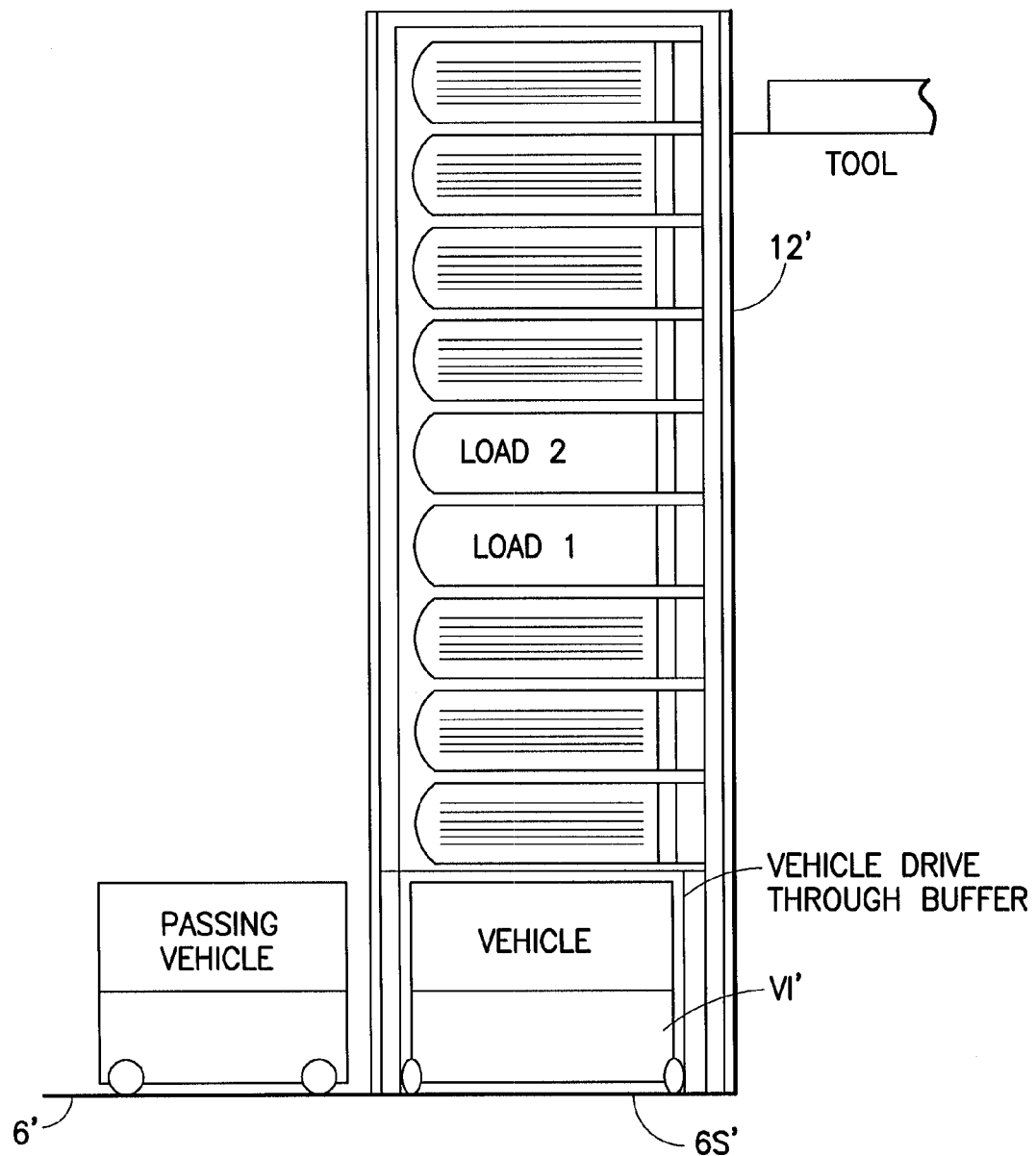

The transportation system 6 (a schematic plan view of which is shown in FIG. 1A.) may comprise one or more transportation systems. The transportation system 6 may also be comprised of, for example, guided vehicles V (with or without integral hoists) and various types of conveyor systems or guideways G. The handling system 8 interfacing between the tool loading/unloading interface and/or buffers station 16 may be configured to simultaneously interface with multiple transport systems of the same or different type, (e.g., vehicle- and conveyor-based transport systems) including those designed to transport conventional 25 wafer FOUPs. As seen in FIG. 1, the guideways or conveyor systems G provide a path traversing a predetermined distance along which the vehicles V are transported. The guideway(s) may be of any suitable type (e.g. rail, track, moving belt, fixed surface) capable of providing guidance of any desired type to the vehicles V for the vehicles to traverse along the guideway(s) G. The guideway(s) may also be able to provide motive means to the vehicle. The vehicle V (one is shown in FIGS. 1-1A but any desired number of vehicles V may move along guideway(s) G) may be capable of autonomous movement or may be moved by conveyor means on the guideway(s) G. Although guideway(s) G is illustrated as being located overhead relative to the processing station 12 and apparatus 10, in alternate embodiments the guideway G may be located at any desired height relative to the apparatus 10 and processing station. As also seen in FIG. 1A, the guideway(s) G is configured to provide an interface I with the handling system 8. In this embodiment, the interface I has been illustrated schematically as being an opening O in the guideway(s), capable of allowing carriers C to pass through the guideway(s) when being transferred between handling system 8 (as will be described in greater detail below) serving tool 12 and vehicle(s) V. In alternate embodiments, the interface between the guideway and apparatus, where carriers may be loaded and unloaded from the apparatus, may have any other desired configuration (i.e. the apparatus may be offset from the guideway). FIGS. 2A-2B are schematic elevation views respectively showing a processing tool 12 and transport system 6 from different (i.e. front and side) directions depict where the guideway is located at the floor elevation in accordance with another exemplary embodiment.

As noted before substrate processing tool or apparatus 12 illustrated in FIG. 1 is merely representative, and the features of the present invention as described with respect to the exemplary embodiments disclosed herein are equally applicable to any other suitable processing apparatus. The substrate processing apparatus may be of any desired type such as a substrate processing tool, a stocker or a sorter. One example of a suitable substrate processing tool is the GX series processing tool available from Brooks Automation, Inc. The processing tool 12 may have a casing or enclosure defining an interior space or chamber(s) in which the chamber atmosphere is capable of being controlled relative to the atmosphere exterior to the tool. For example, the tool 12 shown in FIG. 1 may be the environmental front end module (EFEM) of a processing tool, such as the aforementioned GX series tool. In general, the EFEM of a processing tool is joined to a processing chamber having an isolated atmosphere, such as inert gas or vacuum so that various semiconductor fabrication processes, such as material deposition, lithography, etching, substrate cleansing may be performed without potential contamination. Such a tool configuration is illustrated in the exemplary embodiment shown in FIG. 1B, which will be described in greater detail below. The atmosphere in the processing tool chamber may be controlled in any desired manner. For example the processing tool 12 chamber may have fan filtration unit(s) (not shown) capable of introducing highly filtered (i.e. clean room quality) air into the chamber to establish and maintain a clean room atmosphere therein suitable for IC fabrication to line widths with 45 nm node or less. In alternate embodiments, the chamber may be capable of isolating the interior atmosphere from that exterior. In such embodiments, the chamber may hold an inert gas atmosphere or may hold a vacuum. As noted before and seen in FIG. 1, the processing tool 12 has loading/unloading interface or load port 14 allowing substrates to be loaded and unloaded without compromising the interior atmosphere.

In the exemplary embodiment shown in FIG. 1, the tool 12 has, a multi-dock loadport 14. In the exemplary embodiment illustrated in FIG. 1, the load port 14 is mated to the front face 12F of the tool 12. The term "front" is used for convenience to identify a side of the tool in a given reference frame and in alternate embodiments the load port may be located on any desired side (including top or bottom sides) of the tool. In the exemplary embodiment, for example when tool 12 represents an EFEM of a processing tool, the processing components within the tool (e.g. substrate transport robot, load locks, transport chamber, processing modules) may be arranged behind or to the rear (along an axis projecting into the panel)

of the front face 12F of the tool shown in FIG. 1. The load port 14 may be integral to the face 12F of the tool or may be a modular section (as will be describe below) attached to the tool face 12F at a suitable mounting interface. The load port 14 generally has loading opening(s) therein, as will be described in greater detail below, through which substrates may be transferred into and out of the tool 12. The load port LP may also have a closure(s) capable of closing or blocking the opening(s), at least sufficiently to maintain the chamber interior atmosphere uncompromised, when the opening(s) is otherwise exposed to the exterior atmosphere. Suitable examples of load ports are disclosed in U.S. Pat. No. 5,772, 386, dated Jun. 30, 1998; U.S. Pat. No. 6,071,059, dated Jun. 6, 2000; U.S. Pat. No. 6,375,403, dated Apr. 23, 2002; U.S. Pat. No. 6,461,094, dated Oct. 8, 2002; U. S. Pat. No. 6,609, 876, dated Aug. 26, 2003 and U.S. Pat. No.6,837,663, dated Nov. 4, 2005 which are incorporated by reference herein in their entirety. The load port 14 may have a carrier holding or docking station that has a suitable support enabling a substrate carrier C to be docked to the load port so that substrates may be transferred between carrier and tool 12 along a transport path through one of the load port opening(s). In this exemplary embodiment, the load port 12 may have an associated docking station (as will also be described in greater detail below), for each loading opening. The loading opening and associated docking station may be arranged in loading opening/docking station pairs (i.e. one loading opening to one docking station). From hereon the term docking station will be used when referring to a loading opening/docking station path. The load port docking stations 14A-14D of load port 14 are shown schematically in FIG. 1. The carrier support (structure) 14AF-14DF is shown to indicate the location of each docking station 14A-14D (carriers C are located on some docking stations supports). In this embodiment, the carrier support 14AF-14DF are schematically shown as being located adjacent the loading opening (as may be realized, the area in FIG. 1 for or where the carriers C are located in the docking stations indicate the location of the loading opening) of the corresponding docking station. In alternate embodiments, the carrier support of the docking station may be located in any other desired position relative to the loading opening. For example, the carrier support for a given docking station may be offset from the loading opening and other load port loading openings of other docking stations may be located between carrier support and loading opening of the given docking station. As also seen in FIG. 1, the docking stations 14A-14D of load port 14 are substantially similar to each other. Each docking station 14A-14D being capable of interfacing with similar carriers C (carriers having the same configuration and capacity). In alternate embodiments, the load port may have dissimilar docking stations, capable of interfacing with different configuration/capacity carriers.

As noted before, the load port 14 in this exemplary embodiment is a multi-dock load port with multiple docking stations 14A-14D (four docking stations 14A-14D are illustrated in FIG. 1 for example purposes, and in alternate embodiments more or fewer docking stations may be provided). In the embodiment shown, the docking stations 14A-14D are offset vertically with respect to each other. The docking stations may be substantially aligned in a vertical row if desired, or may both horizontally and vertically offset in any desired arrangement such as diagonally aligned or staggered arrangement. In the exemplary embodiment, the docking stations 14A-14D are sized to correspond to a conventional load port docking opening for a conventional 25 wafer FOUP. By way of example, in this embodiment, the load port 14 has four docking stations 14A-14D, and the space envelope of the four docking stations including the space for having carriers C docked thereto is substantially the same as the space envelope of a single conventional 25 wafer FOUP load port as defined by the BOLTS-M interface standard (SEMI E63). The docking stations 14A-14D of the load port 14 in the exemplary embodiment are capable of simultaneously handling a suitable number of reduced capacity carrier C that tool throughput is not compromised relative to conventional tools. In alternate embodiments, the number and size of load port docking stations may be varied as desired, and the load port docking area (encompassing all load port docking stations may have a space envelope of any desired size and shape). Further, the capability for fast swap replacement of carriers at the load port docking stations (as will be described below) improves the tool throughput.

Figure 5A:
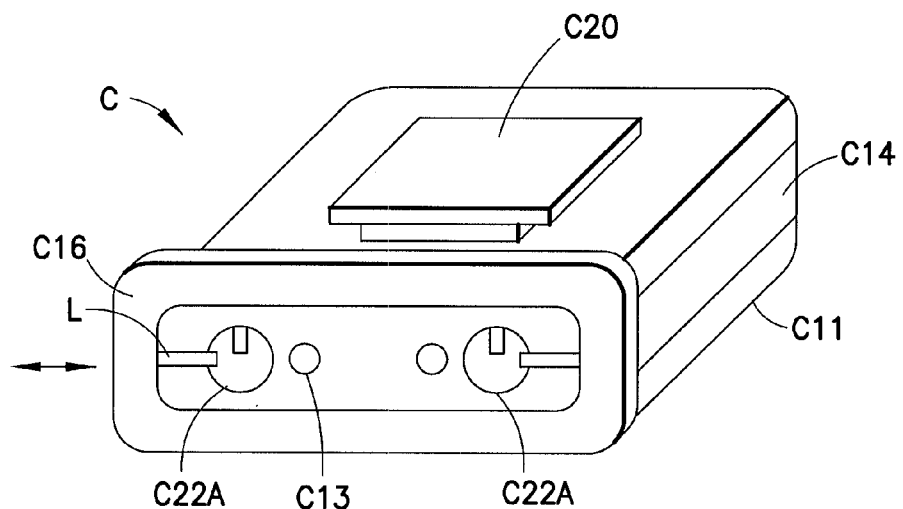
FIG. 5A is a schematic perspective view of a substrate carrier, used with the processing system, in accordance with still another exemplary embodiment.

Referring now to FIG. 5A, there is shown a representative substrate carrier C that may be used with the processing system 10 in FIG. 1. A suitable example of a substrate carrier having similar features as carrier C is disclosed in U.S. patent application titled Reduced Capacity Carrier and Method of Use; attorney docket no. 390P011935-US(PAR) filed Aug. 19, 2005, which is incorporated by reference herein in its entirety. The substrate carrier C generally has a casing 11, with one or more substrate holding C14 slots for the placement of substrates S therein. The substrates may be any desired substrate such as 200, 300, 450 mm (or any other diameter) semiconductor wafer, or reticle or flat panel for flat panel displays. The carrier casing is capable of holding a controlled atmosphere inside the carrier. In the exemplary embodiment shown in FIG. 5A carrier 10 may have a side opening door 13 and features 16 for kinematic docking to the load port docking stations 14A-14D that will open the carrier door as will be described more below. In alternate embodiments, other door and docking arrangements may be provided, such as flanges, guides or rollers for example. In other alternate embodiments, the carrier may be bottom opening. In this embodiments, the carrier also has features 20 allowing the carrier to be handled using an overhead hoist, similar or alternate material transport device. As seen in FIG. 5A, the door 13 may be locked with dual (or single) cam mechanism and may have a hole and slot 22A for pin locating, such as for example, in a similar fashion to conventional SEMI standard FOUP carriers.

Referring again to FIG. 11 as noted the tool 12 may have a buffer station 16 with a desired number of carrier buffer locations 16A-16D. Four buffer locations 16A-16D are shown in FIG. 1 for example purposes and in alternate embodiments the buffer station may have more of fewer buffer locations as desired. In this embodiment, each buffer location is capable of holding a substrate carrier C, though in alternate embodiments, any desired number of carriers may be buffered at a buffer location. The buffer station 16 may be located adjacent the load port 14 and within reach of the carrier handling system 20 linking the tool 12 and carrier transport system 6. The buffer station 16 may be located between load port 14 and transport system 6. For example, in the embodiment shown in FIG. 1, the buffer station 16 is located between over head transport system 6 above and the load port 14 below the buffer station. Accordingly, the carrier handling system 20 transiting between load port 14 and transport system 6 is able to queue carriers in buffer locations 16A-16D for loading in the load port docking stations and/or loading in the vehicles V of the transport system 6. Referring now to FIG. 2A-2B, the tool 12' in this exemplary embodiment, which is similar to tool 12 except as noted, has a buffer station 16B' located between the floor lever transport system 6' below and load port 14' above. In this exemplary embodiment, the tool 12' has another buffer station 16V'. The second buffer station 16V' is located on the opposite (i.e. upper) side of the load port from (lower) buffer station 16B' so that the load port 14' is substantially sandwiched between buffer stations 16V' 16B'. In alternate embodiments, the buffer station may be located on an opposite side of the load port from the transport system. In the exemplary embodiments illustrated in FIGS. 1-1A, and 2A-2B, the buffer station are substantially aligned with the corresponding load ports (e.g. buffer station 16 and load port 14 and buffer stations 16V', 16B' and load port 14'). In alternate embodiments, the buffer station and load port for a corresponding tool may be vertically offset from each other. As shown in FIG. 1, in this exemplary embodiment the load port 14 (as well as buffer station 16) is substantially aligned with transport vehicle load/unload station 6S, a location where transport vehicles V on transport system 6 are positioned for transfer of carriers at interface I. Similarly, in the exemplary embodiment illustrated in FIGS. 2A-2B, the load port 14', and buffer station 16V', 16B' are aligned with load/unload station 6S' of transport system 6. As may be further realized, the transport system 6, 6' in the exemplary embodiments provides a transport path that crosses the load port 14, 14' of the tool 12, 12'. Referring to FIG. 1A, transport system 6 defines movement path for transport vehicle V, indicated by arrow M, that crosses over load port 14. As may be realized, the transport vehicle V has a contact arrangement to guideway G that allows the vehicle to span opening O in the guideway and move over the opening and without interference with handling system 20 structure. Referring to FIGS. 2A-2B, the movement path (indicated by arrow M' in FIG. 2A) of vehicle V1' crosses through buffer station 16B'. The buffer station 16B' and handling system 20' are arranged to allow vehicle V1' on transport system 6' to move through the buffer station and handling system L e.g. buffer station and handling system structure bridges across gap allowing passage of vehicle V1. In alternate embodiments, the transport system may be located so that the transport system guideways, or transport vehicle supported from and moving along the transport system guideways crosses through the docking stations for the load port of the processing tool.

Referring again to FIG. 1 the load port docking stations 14A-14D may be loaded/unloaded by handling system 20, or if desired manually. Similarly, the handling system 20 is capable of loading/unloading carriers from any desired buffer locations 16A-16D. In this embodiment, the handling system 20 is located in front of the front face of tool 12 and adjacent the load port 14 and buffer section 16 in what may be referred to as a right-hand tool station version (i.e. when locking in the forward direction (i.e. out of face in FIG. 1) from the tool front face, the load port/buffer station is to right to handling system). The load port 14/buffer section 16 along with the handling system 20 may have a space envelope that occupies the space typically commensurate for two adjacent conventional load ports attached to a conventional EFEM system. In alternate embodiments the tool may have more loadport locations (as shown in phantom in FIG. 1 another load port location may be provided on the opposite side of the handling system) Tool stations may be constructed in right- and left-hand versions, whereby the elevator and loadport positions are reversed and additional capacity is available at the process tool. FIGS. 2A-2B show an exemplary embodiment with a left-hand version.

Figure 3:
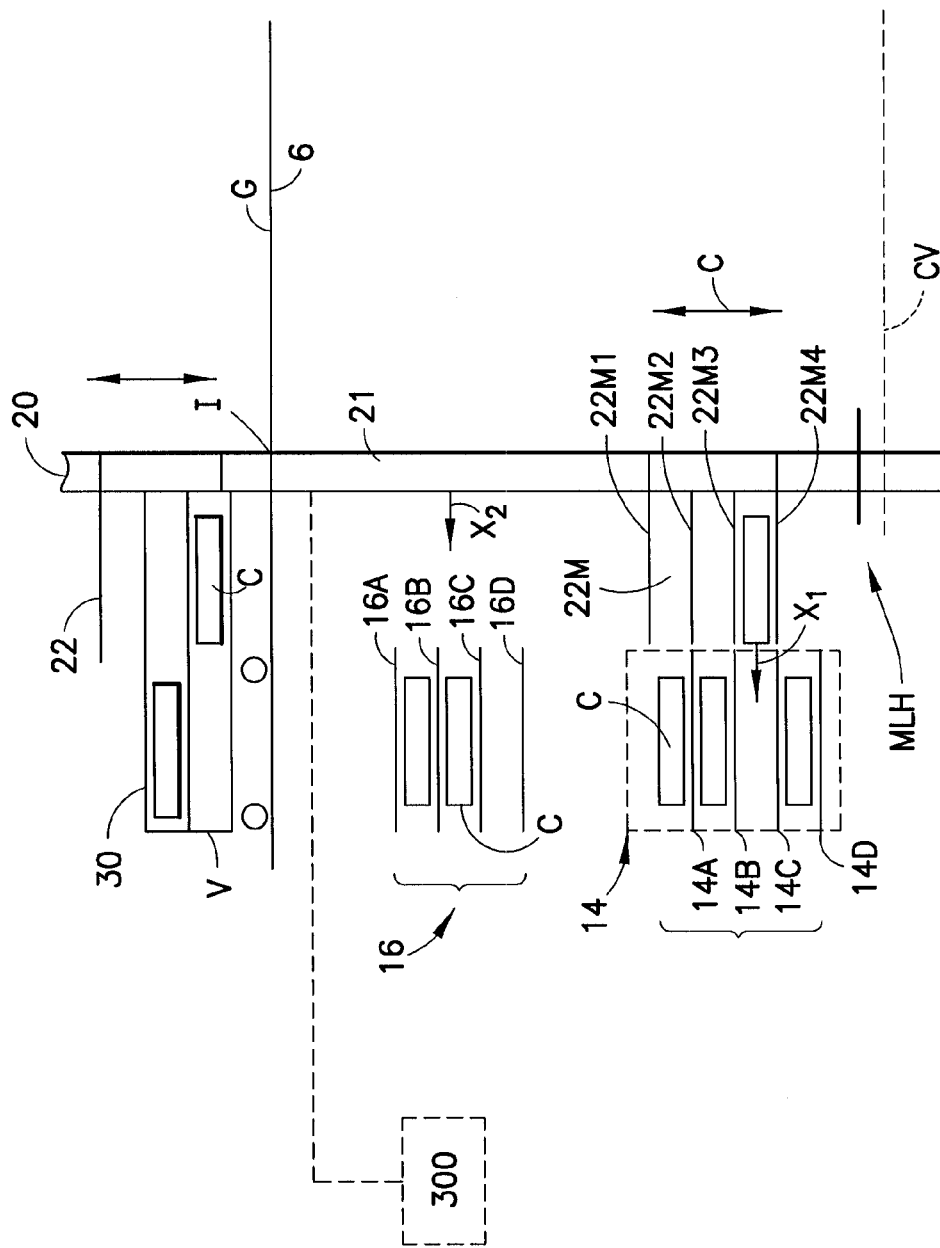
FIG. 3 is another schematic elevation view of a substrate processing system in accordance with another exemplary embodiment.

Referring still to FIGS. 1, 2A-2B, the handling system in this embodiment is an elevator 20 that generally comprises a guideway 21 and carrier elevator(s) or lift(s) 22. The elevator transfers carriers among several elevations to access the transportation system (e.g., over head transport system 6, floor level transport system 6', conventional conveyor system (not shown), or manual delivery system), buffer nests 16A-16D, and loadport docks 14A-14D. In this embodiment, the guideway 21 is illustrated as being substantially vertically oriented, and extending from the (over head) transportation system 6 (or floor transport system 6') at least to the multi-dock load port 14, 14'. Referring also to FIG. 1, in this exemplary embodiment the guideway 21 may also extend below the loadport 14 to a conveyor system CV or to a position for ergonomic manual loading. In alternate embodiments the guideway may be oriented as desired and may extend to any desired length. As seen best in FIG. 3A (schematically illustrating a plan view of the elevator 20), the guideway 21 generally comprises rails, tracks or belts 21A, 21B forming both a transport pathway and support for the carrier lifts 22. In this embodiment, two rails 21A, 22B are shown for example purposes, and the guideway 21 may include any desired number of rails/guides. The rails 21A, 21B are illustrated schematically in the embodiment shown in FIG. 3A as being similar and having a generally round cross-section, though the rails 21A, 21B may have dissimilar cross-sections, of any suitable shape to enable the lifts 22A, 22B to movably engage the rails so that the lifts are capable of bi-directional movement if desired along the guideway 21 in the direction indicated by arrow Z in FIG. 3. In alternate embodiments, each rail 21A, 21B may comprise multiple substantially parallel rails.

Figure 3A:
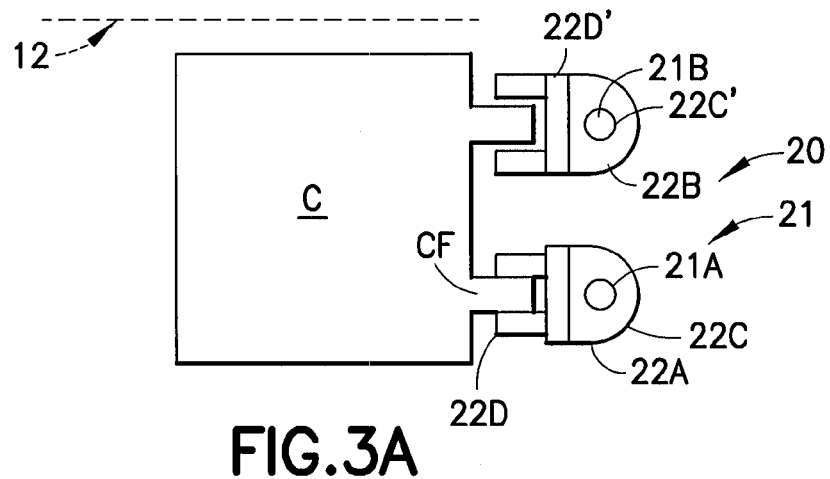
FIG. 3A is a schematic plan view of an elevator transport of the substrate processing system in accordance with another exemplary embodiment.

FIG. 3A shows two carrier lifts 22A, 22B, though any desired number of lifts may be used with guideway 21. In this embodiment lift 22A is mounted to traverse along guide rail 21A, and lift 22B is mounted to traverse along guiderail 21B. As noted above, additional lifts similar to lifts 22A, 22B may be positioned to traverse along either or both rails 21A, 21B as desired. In this embodiment, lifts 22A, 22B are generally similar. Each lift has a base section 22C, 22C', holding the lift on the guiderail and a carrier gripper or carrier support section 22D, 22D', extending from the base section. The base section 22C, 22C', may have any desired configuration to engage rail 21A, 21B. A motor or other motive system (not shown) may be provided in the base section 22C, 22C' or the rail 21A, 21B or both. For example, the motive system may include any one of a electric servomotor, stepper motor, magnetic linear motor or other suitable actuator, such as pneumatic actuator, for moving the lift independently, and bidirectionally along rails 21A, 21B in the direction indicated by arrow Z in FIG. 3. In alternate embodiments base sections 22C, 22C' may be moved on rails 21A, 21B by an endless loop/belt configuration. In that case, the lifts may be fixedly mounted to the belts to move substantially in unison with the belts. In that case, one base section, 22C, may move in one direction (e.g. up) and the other base section, 22C', may move in the opposite direction (e.g. down).

As seen in FIG. 3A, the carrier support section 22D, 22D' of the lifts has support members such as support arms, tynes, fingers with a configuration to hold a carrier C on the lift. The configuration of the support section 22D, 22D' shown in FIG. 3A is schematic and merely exemplary. In alternate embodiments the support section may have any other suitable arrangement capable of supporting a carrier and passing by each other when one or both lifts are empty. The carrier support section 22D, 22D' are shown in FIG. 3A respectively in hold (or closed) and release (or open) positions. The support members of the carrier support section 22D, 22D' may be shaped to cooperate with desired features or surfaces CF of the carrier. Actuation of the support section 22D, 22D' may be effected by any suitable actuator such as electrical or pneumatic spring load solenoid. As seen in FIG. 3A, lifts 22A, 22B respectively on rails 21A, 21B are capable of moving past each other with at least one carrier lift 22A, 22B holding a carrier C thereon. The carrier support section 22D 22D' may be configured to hold one or more carriers (e.g. in a vertical stack). This enables a fast swap of carriers at a given lift. As one carrier is realized and handed off from a given lift 21A, 21B, another carrier may be captured and grabbed by the same lift. In alternate embodiments, additional lifts may be added to the same guideways or to different guideways in the same column. The inclusion of additional lifts also may provide the ability to do the above-mentioned "fast swap", as well as providing a fault tolerance system through redundant carrier delivery mechanisms. As may be realized the carrier lifts 21A, 21B are able to traverse a common vertical right-of-way or space. For example, a full lift 22A, and an empty lift 22B, or two empty lifts may pass each other within the common right-of-way or space as shown in FIG. 3A. The tool buffer control system 300 (see FIG. 3) will shuttle one carrier C from its respective lift to a buffer shelf prior to the two lifts with carriers occupying the same right-of-way or space. In the exemplary embodiment shown in FIG. 3, the guideways may be extended past the lowest carrier delivery location as described allowing a disabled lift to be pushed out of the way thus allowing the tool buffer to continue to cycle carriers through the system. The disabled carrier may be manually moved to the extended location or moved by another mechanical device such as an active lift. Alternatively, the guideway 21 could be continuous, as in a vertical carousel. Each lift may contain an active element (i.e., prime mover) capable of shuttling a carrier horizontally (in the direction indicated by arrow X in FIG. 3) between the elevator column 20 and buffer locations or load port docking stations that may be passive.

Referring again to FIG. 3, there is shown another exemplary embodiment of the elevator 22M. Elevator 22M in this embodiment has several platforms 22M1-22M4 (four platforms are shown for example but any desired number may be used) mounted with a fixed or adjustable vertical pitch to one or more lifting elements similar to lifts 22A-22B. The platforms form vertically translating magazines for substrate carriers. The carrier platform pitch may substantially match that of the loadport docks 14A-14D and buffer locations 16A-16D. An active horizontal shuttling device may be deployed on each loadport dock station, buffer, location and/or carrier of the transportation system. The horizontal shuttling device may move the carriers from the transportation system to the load port and buffer locations and back again in the direction indicated respectively by arrows $X_1$, $X_2$ in FIG. 3. Alternatively, the active horizontal shuttling elements could be grounded at elevations where transfers occur, to reduce the quantity of active elements employed. Still in another alternate embodiment, the tool station may have passive load port magazines, passive buffer nests, and use substrate carriers capable of autonomous mobility.

The carrier trajectory during the shuttling motion between loadport docks 14A-14D, or buffer shelves 16A-16D and the elevator system 20 may be accomplished in the horizontal plane. Picking and placing carriers by incorporating a small vertical motion of the lifts 21, for example to engage and disengage passive nesting carrier to station or docking features (not shown) may be possible. To facilitate a vertical and horizontal shuttle, the minimum pitch between the nested carriers C may be increased. In the embodiment shown in FIGS. 1-3 shuttling of the carriers may be achieved by horizontally translating and constraining the nested carriers, if desired, by a movable latch or through the application of a retaining force, which causes the carrier to remain in a fixed, know location. The retaining force may be applied through magnetic attraction, fluid pressure, or other known means. Control of the motions of the lifts 22 during transport on elevator system 20 and during shuttling of carriers to and from the load port docks 14A-14D or buffer stations 16A-16D is performed from controller 300.

Now referring to FIG. 4, to accomplish the horizontal shuttling, means may be provided for support and guidance of the carriers, as well as transmission and coupling of the motive force. Support and guidance may be achieved for example by various arrangements of wheels, rails, skid plates, air bearings, magnetic forces, and the like as shown in the embodiments illustrated in FIGS. 4A-4F. FIG. 4A illustrates a carrier C1 in accordance with an embodiment where the carrier frame CA has wheels CWV and CWH mounted thereon for providing both vertical and lateral support. In FIG. 4B, an exemplary embodiment of the carrier C2 is seated against wheels WV, WH (possibly mounted on a supporting track T depending from either the tool station 12 or the elevator 20). In the exemplary embodiment illustrated in FIG. 4C, skid plates SV, SH (mounted either to the carrier frame CA or the supporting structure on which the carrier is supported) movably support the carrier C3. In the exemplary embodiment shown in FIG. 4D, the supporting track T1 and/or the carrier frame includes air bearings or mag bearings BV, BH for supporting and guiding the carrier C4. In FIG. 4E, the carrier C5 rests on a movable conveyor $T_c$ (belt or roller) and is guided laterally by side guide rails SGR as shown. In FIG. 4F, the carrier C6 frame has grooved wheels CWG mounted thereon riding on support rails TR. Linear motion can be developed by rotary motors driving belts, ropes, lead screws, robotic arm links, or skewed roller mechanisms, or by linear motors, pneumatic actuators, and the like. The linear motion so developed may be coupled to the carrier for example by mechanical interference, friction, magnetic force, or fluid pressure.

Figure 7:
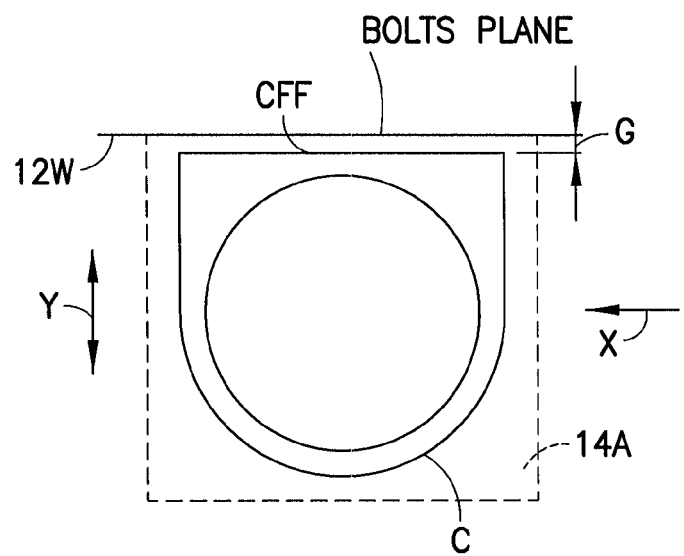
FIG. 7 is a schematic plan view of a processing tool carrier holding station of the processing system and a substrate carrier in accordance with an exemplary embodiment.
Figure 4A:
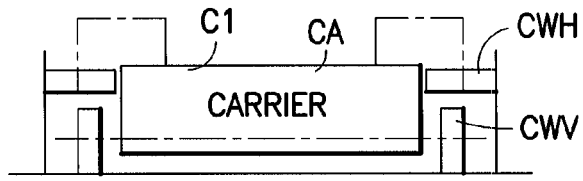
FIGS. 4A-4F are schematic elevation views each of which showing a substrate carrier, used with the processing system, in accordance with different exemplary embodiments.
Figure 4B:
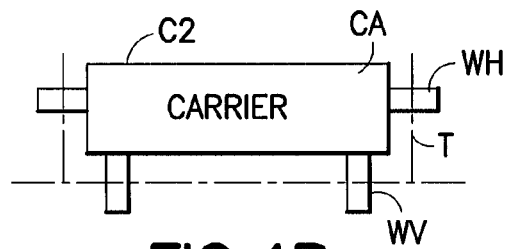
Figure 4C:
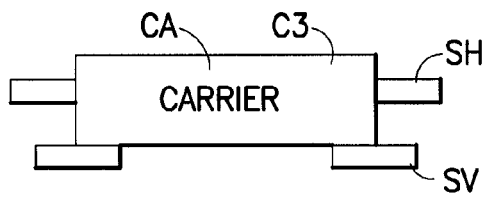
Figure 4D:
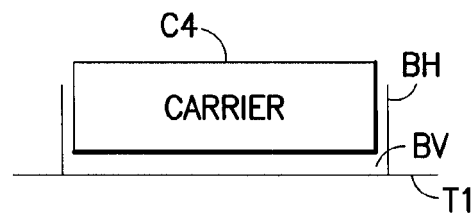
Figure 4E:
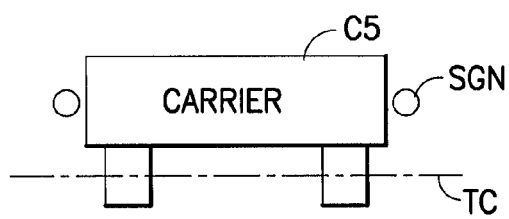
Figure 4F:
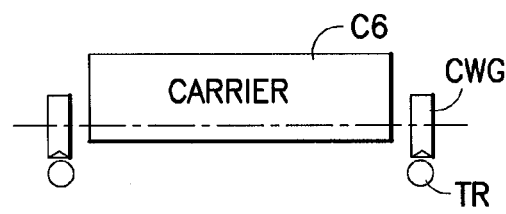

Referring now to FIG. 7, there is shown a plan view of a carrier C positioned on a load port docking station 14A (of the load port 14, see FIGS. 1-3) from the elevator 20 in accordance with an exemplary embodiment. The approach in accordance with the exemplary embodiment is to advance the carrier C from the side horizontally (in the direction indicated by arrow X) to a location relatively close to the backside of the loadport opening wall 12W. A small gap G may be formed between the front face CFF of each carrier translated and the backside 12W of the loadport opening wall. The position, shown in FIG. 7, of the carrier C on the docking stations 14A may be a registration or pre registration position from which the carrier C is registered as will be described below by closing gap G. In contacts, docking at the BOLTS plane is conventionally accomplished by gross carrier horizontal translation normal to the load port opening (e.g. in the direction indicated by arrow Y) which consumes time. Moreover, as previously described, front docking of conventional front opening carriers uses registration of the carrier along both its bottom (carrier to shuttle) and its front face (to seal the carrier load port interface and engage the carrier door). The resulting condition is overconstrained.

Referring now to FIG. 8A there is shown an enlarged elevation view of a load port docking station LP14A, buffer locations B16A, B16B and carriers C in accordance with another exemplary embodiment. Carriers C are substantially the same as the carriers described before. The load port docking station LP 14A is substantially similar to any one of the load port docking stations 14A-14D in FIG. 1 or load port docking stations 14A'-14B' shown in FIGS. 2A-2B.

In the case of a front-opening carrier, using the front face for position registration as in the exemplary embodiment described herein overcomes a deficiency in conventional 300 mm FIMS (front opening interface mechanical standard) compatible interface, viz, concurrently controlling the horizontal docking interface and the vertical charging interface. This condition as noted before in conventional carriers is over constrained and is accommodated by maintaining a gap at the front interface between carrier and load port raising the potential of undesired contamination to the substrates load port and carrier.

Figure 8B:
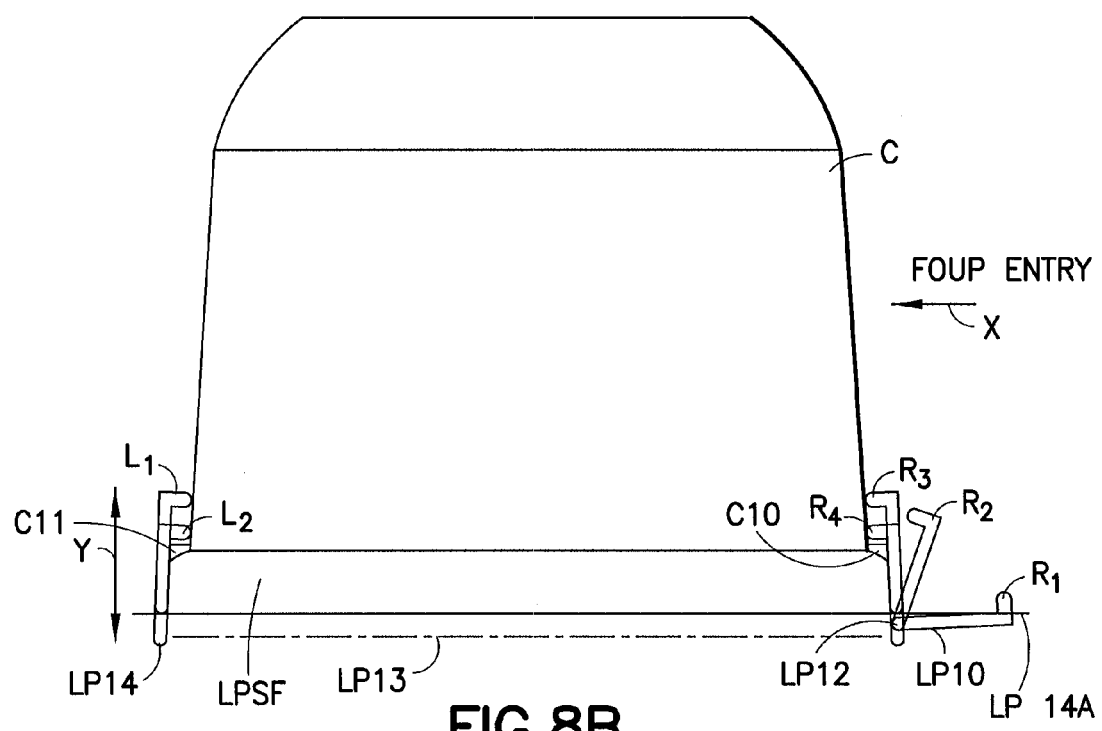

As shown in FIG. 8A, such a single-plane interface eliminates the bottom interface and associated shuttle mechanism of conventional systems, allowing the possibility of dense vertical packaging at loadports, or in storage/buffer locations (see for example FIGS. 2A-2B). In the embodiment shown, supports or shelves LPS may be provided to rest the carrier(s) C but without registration features. To avoid generating over constraints on registration, the shelves and/or carrier legs may be arranged so that the carrier when seated freely on the shelf is pitched relative to the registered position. Registration of the carrier as will be described below results in the carrier being lifted off the shelf. Referring also to FIG. 8B there is shown a plan view of carrier C interfaced to the load port docking station LP14. In this embodiment, the support shelf may define a registration feature for the carrier C, whereby the bottom of a front carrier structure C6 is registered on a flat surface LPSF. The top or upper carrier portion C8 is secured by a clamp mechanism LP10 which supports the carrier in a cantilevered manner from the load port. In particular, as the clamp LP10 is engaged, the rear of the carrier C is lifted from its passive support location. The front flat registration surface LPSF may also act as a contamination shield to lower interfaces. The clamp mechanism CP10 has opposing clamp sections LP12, LP14 as shown. The clamp sections are movable respectively between positions R1-R4 (for clamp LP12) and position L1-L2 (for clamp LP14) as seen clamp part LP12 is capable of both rotation and transverse motion and clamp part LP14 is capable of only transverse motion in the direction indicated by arrow Y in FIG. 11. Clamp part LP12 may be actuated with a four-bar linkage that causes clamp part LP14 to engage and pull the carrier flange toward the port. To allow the carrier C to be placed by a mechanism (of the docking station or elevator) or by hand from the side in the direction indicated by arrow X, the clamp part LP12, retracts to the position labeled R1. The two clamping parts LP12, LP14 may be tied together with a link (shown schematically as, feature LP13 in FIG. 8B) to enable a single drive axis. As seen in FIG. 8B, the carrier C has kinematic features C10, C11 that are respectively engaged by the closing clamp parts LP12, LP14 to draw and hold the seating surface of the carrier face against a mating surface of the load port LP. The clamp mechanisms may be located on the sides of the port opening (as shown in FIG. 8B) to minimize the potential of particulate contamination entering the interface area.

Figure 9:
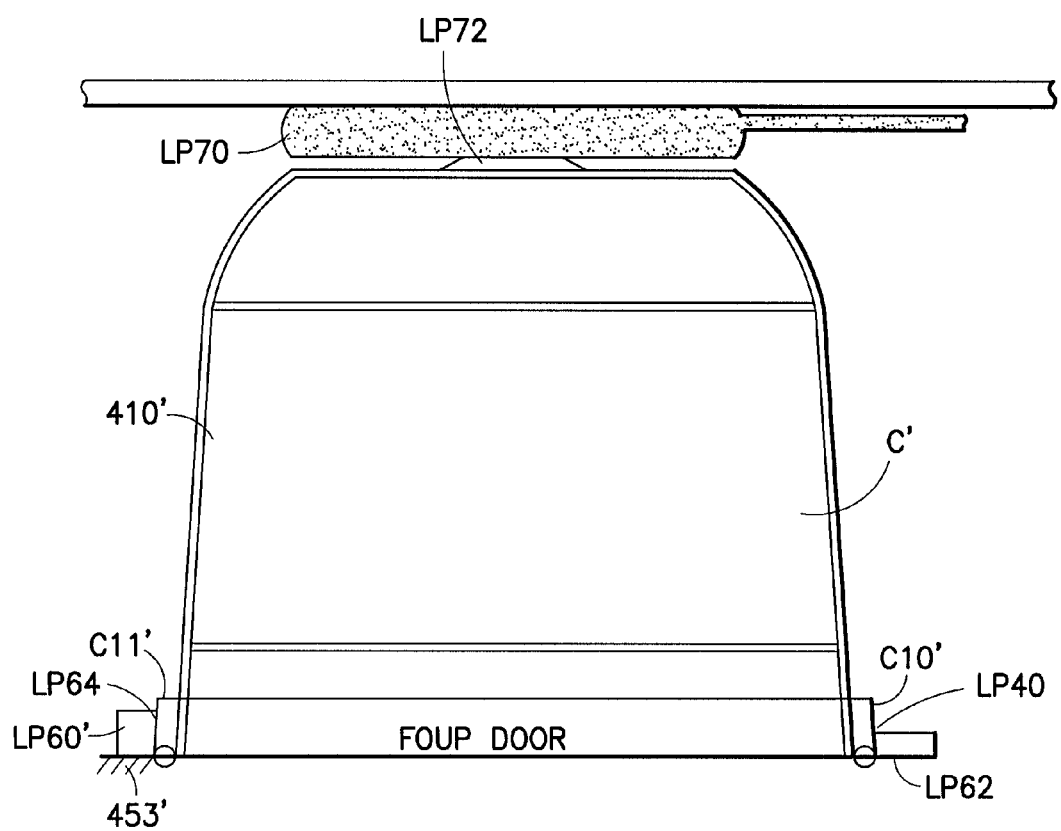
FIGS. 9-10 are different schematic plan cross-sectional views of a load-port section and substrate carrier according to another exemplary embodiment.

Another exemplary embodiment of the registration of a carrier C' to a load port docking station is shown in FIG. 9. In this embodiment, the carrier C' is advanced and secured against the port using a compliant rear force. In the exemplary embodiment, an inflating bladder LP10 is used to advance the carrier C' and secure it against the front interface. An adjacent (or same) bladder may have the capability of being evacuated to withdraw the carrier C' from the port. The bladder LP70 has a vacuum cup LP72 to secure the carrier C' while retracting. Any suitable compliant bladder or fluid actuated bellows device may be used. In alternate embodiments any other desired compliant actuation system may be used. This arrangement eliminates the conventional shuttle mechanism (1 axis) and conventional carrier hold-down (typically 2 axes) mechanisms of conventional FIMS loadports. As seen in FIG. 9 the front interface of the docking station in this embodiment includes an adjacent passive registration lead-in LP40. The lead-in is preferably located to the sides of the port to minimize the potential of particulate contamination entering the interface area. The front of the carrier C' in this embodiment has kinematic facets (seating surfaces) C10', C11' located on the lateral sides of the carrier. The load port docking station lead in LP40 has a complementing kinematic interface LP60' that is passive with guide and seating surfaces LP62', LP64' to engage the mating kinematic facets C10', C11' of the carrier thereby guiding and engaging the carrier so that the carrier is held cantilevered from the load port interface similar to carrier C' in FIG. 10. Suitable seals (e.g. O-rings) in the load port opening perimeter ensure sealing between carrier casing and load port.

Figure 10:
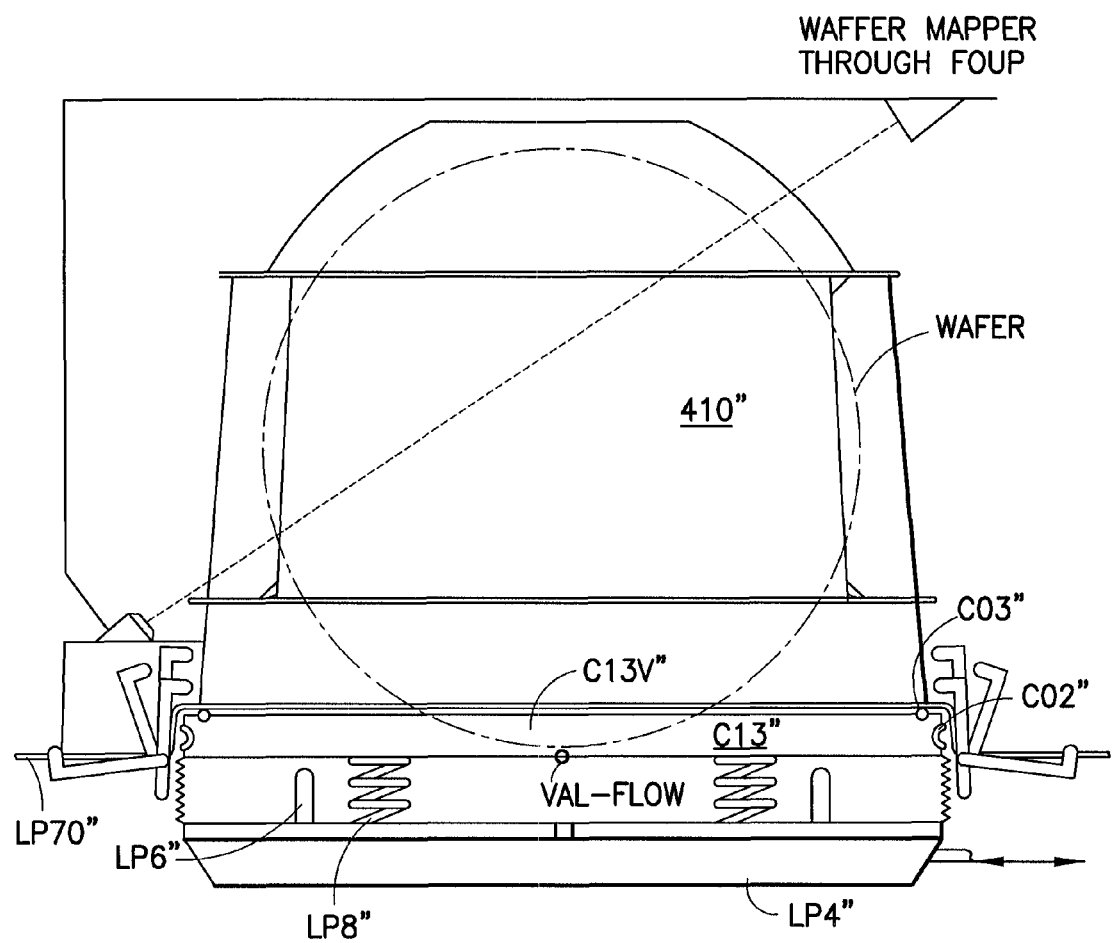

Referring now to FIG. 10, there is shown a plan view of carrier C" interfaced to the load port docking station in accordance with another exemplary embodiment. In this embodiment a bellows LP70" is used to effect the latching and removal of the carrier door. In this embodiment advancement and registration of the carrier C" to the load port interface may be performed similarly to carrier C in FIG. 8A-8B. As seen in FIG. 10 in this embodiment the carrier door C13" may be held in the frame of the carrier opening by a perimeter deflatable retainer C02" on the door C13" that engages a recess in the carrier frame (not shown) when the door is in the closed position and the retainer is inflated. In alternate embodiments, the door retainer may be any suitable pneumatic actuation members (e.g. pins, balls). In other alternate embodiments, the deflatable retainer of the carrier door may serve also as the seal between the door and carrier casing. In the exemplary embodiment shown the carrier opening frame may have a separate seal C03" to seal the interface between door C13" and carrier casing. As may be realized, registration of the carrier C" to the load port as previously described results in the bellows LP70" being brought into contact with the carrier door as shown in FIG. 13.

Upon contact with the carrier door, the bellows is evacuated (by a suitable system) (not shown) to compress it, thereby securing and retracting the carrier door. Guiding registration pins LP6" on the port door LP4" may be used to maintain alignment of the carrier door C13" relative to the port door as it is retracted from, and returned to the carrier. An orifice or opening C13V" in the carrier door may allow vacuum to enter the door C13" and deflate the perimeter deflatable retainer of the door. The spring force of the bellows (or separate mechanical springs LP8" located on the port door) may be sized such that the deflatable retainer C02" collapses prior to the door C13" being removed. Upon venting (which may be filtered) of the port bellows LP70", the spring force reinserts the door C13" into the carrier, and the collapsible retainer re-engages the carrier flange.

Figure 11:
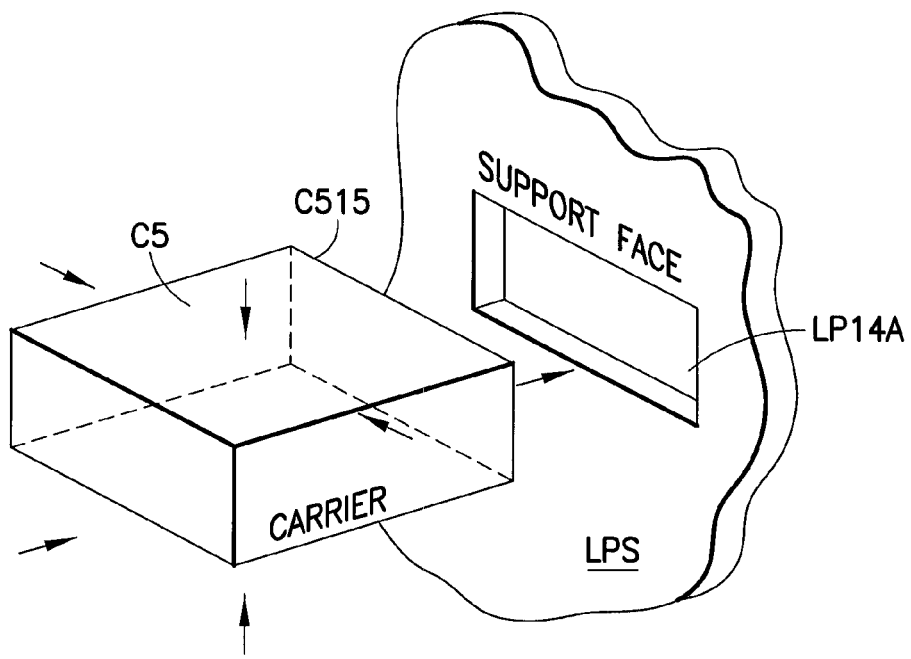
FIGS. 11, 11A-11B are respectively a schematic perspective view and elevation views of a load port section and substrate carrier interface according to an exemplary embodiment.
Figure 11A:
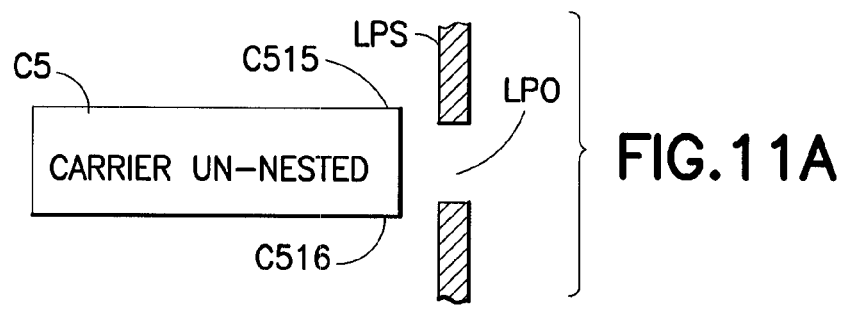
Figure 11B:
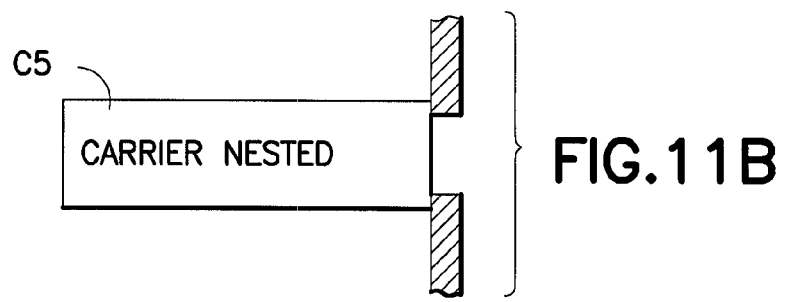

A representative interface between the carrier C5 and a support face LPS for a load port docking station P14A (similar to docking station 14A) according to this exemplary embodiment is shown in FIG. 11. The carrier C5 is shown in FIG. 11 in a position offset from the load port face for clarity. In the Figure, the load port support face LPS is shown as being on the load port face or plate that forms the substrate loading opening LPO of the load port. As may be realized, the load port support face may be any surface facing the interface side C515 of the carrier. The interface side of the carrier C515 has kinematic coupling features C516 as will be described below. Referring now also to FIGS. 11A, 11B there is shown schematic elevation views of the carrier load port interface shown in FIG. 11, with the carrier respectively in docked and undocked positions. In the docked position, the kinematic coupling features C516 on the carrier and on the load port support face LPS are engaged to register and hold the carrier in the desired position and alignment relative to the load port opening LPO.

Figure 12A:
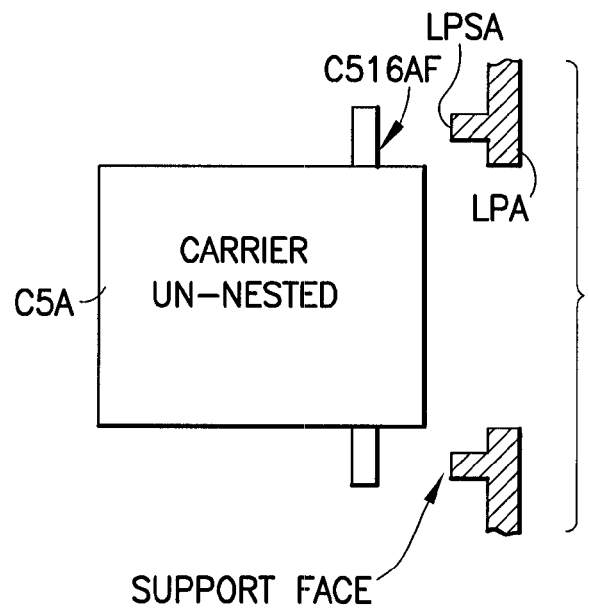
FIGS. 12A-12B are schematic elevation views of load port section and substrate carrier in docked and undocked positions according to an exemplary embodiment.
Figure 12B:
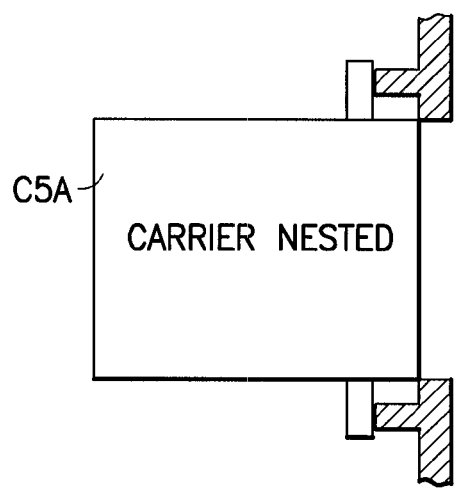
Figure 13A:
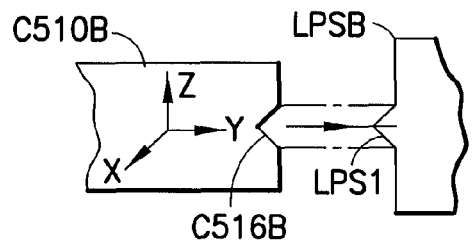
FIGS. 13A-13E are other schematic partial elevation views and a perspective view of possible coupling between load port and carrier according to other exemplary embodiments.
Figure 13B:
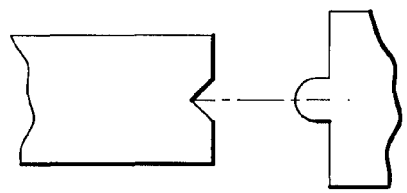
Figure 13C:
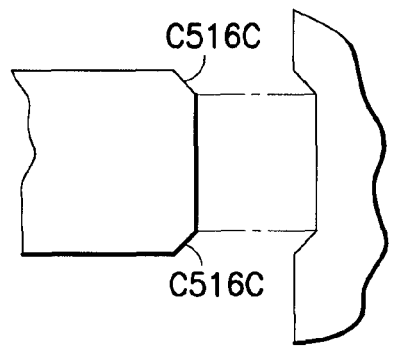
Figure 13D:
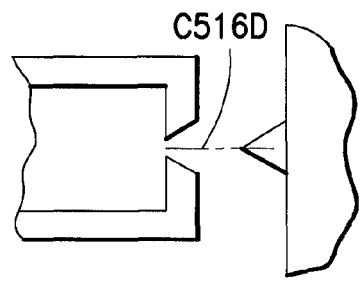
Figure 13E:
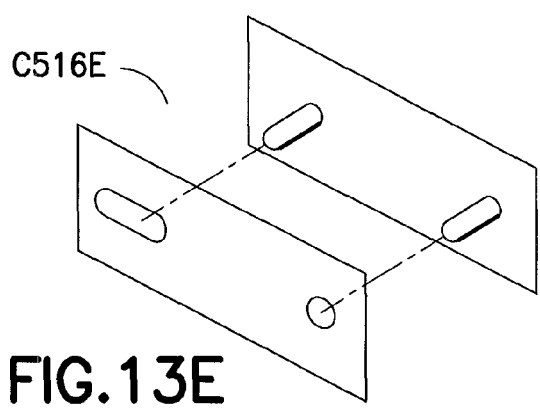

As may be realized, the kinematic coupling features may be of any desired configuration. One exemplary configuration is shown in FIGS. 12A-12B which is a plan view of the carrier C5A in docked and undocked positions relative to the load port. In this embodiment the carrier has laterally projecting surfaces C516AF (for example on side flanges). The load port has projections that define complementing support faces LPSA. FIGS. 13A-13B show another exemplary configuration of the kinematic coupling. In this embodiment, the carrier C510B may have a tapering guide notch C516B in a face facing the load port support surface LPSB. The load port support surface may have a complementing tapering pad section LPS1 for engaging the notch C516B in the carrier. The projection on the load port may be fixed or may be spring loaded. The taper on the faces of the notch and projection are oriented to guide the carrier to the desired position. In FIG. 13B, the tapering projection on the load port is shaped as a rounded pin. In the exemplary configuration shown in FIG. 13C, the carrier has outer chamfered faces C516C that engage complementing angled faces in the load port. In the exemplary configuration shown in FIG. 13D, the carrier has a tapered bore C516D that is engaged by a complementing projection on the load port similar to projection LPS1 in FIG. 13A. FIG. 13E shows the kinematic coupling C516E which has a male portion with engagement pins and a female portion having a fixing hole (locating the male portion in two directions) and an elongated slot engaging the mating pin to float in one direction.

Figure 14:
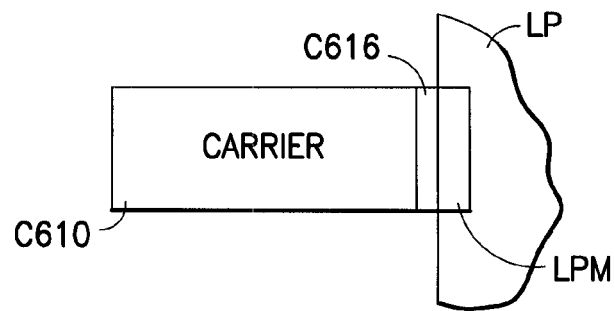
FIG. 14 is a schematic elevation view of an active coupling between load port and carrier.
Figure 15A:
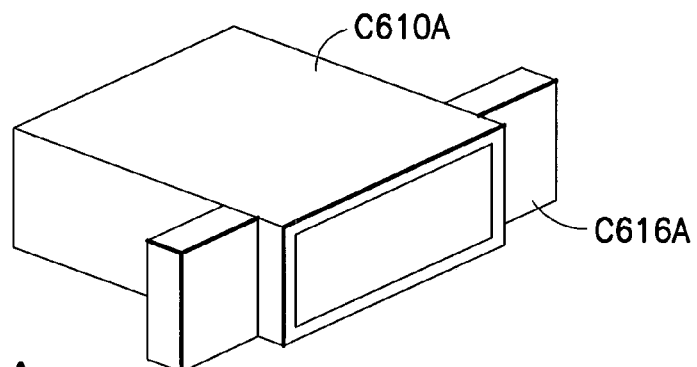
FIGS. 15A-15C are perspective views of the carrier used with the coupling in FIG. 14 in accordance with different exemplary embodiments.
Figure 15B:
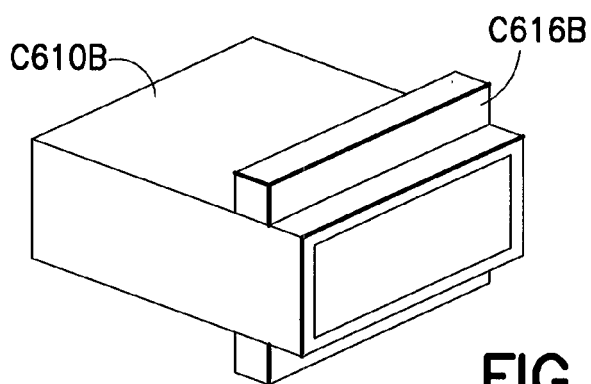
Figure 15C:
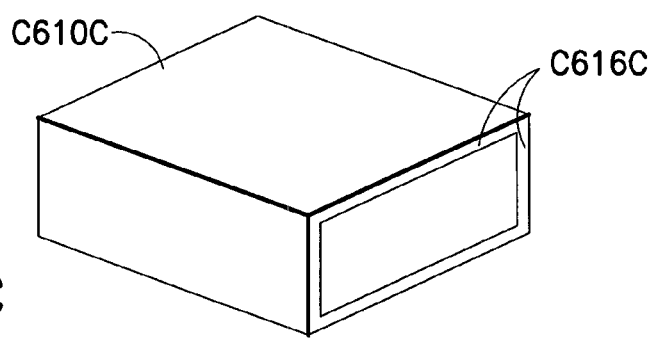
Figure 17:
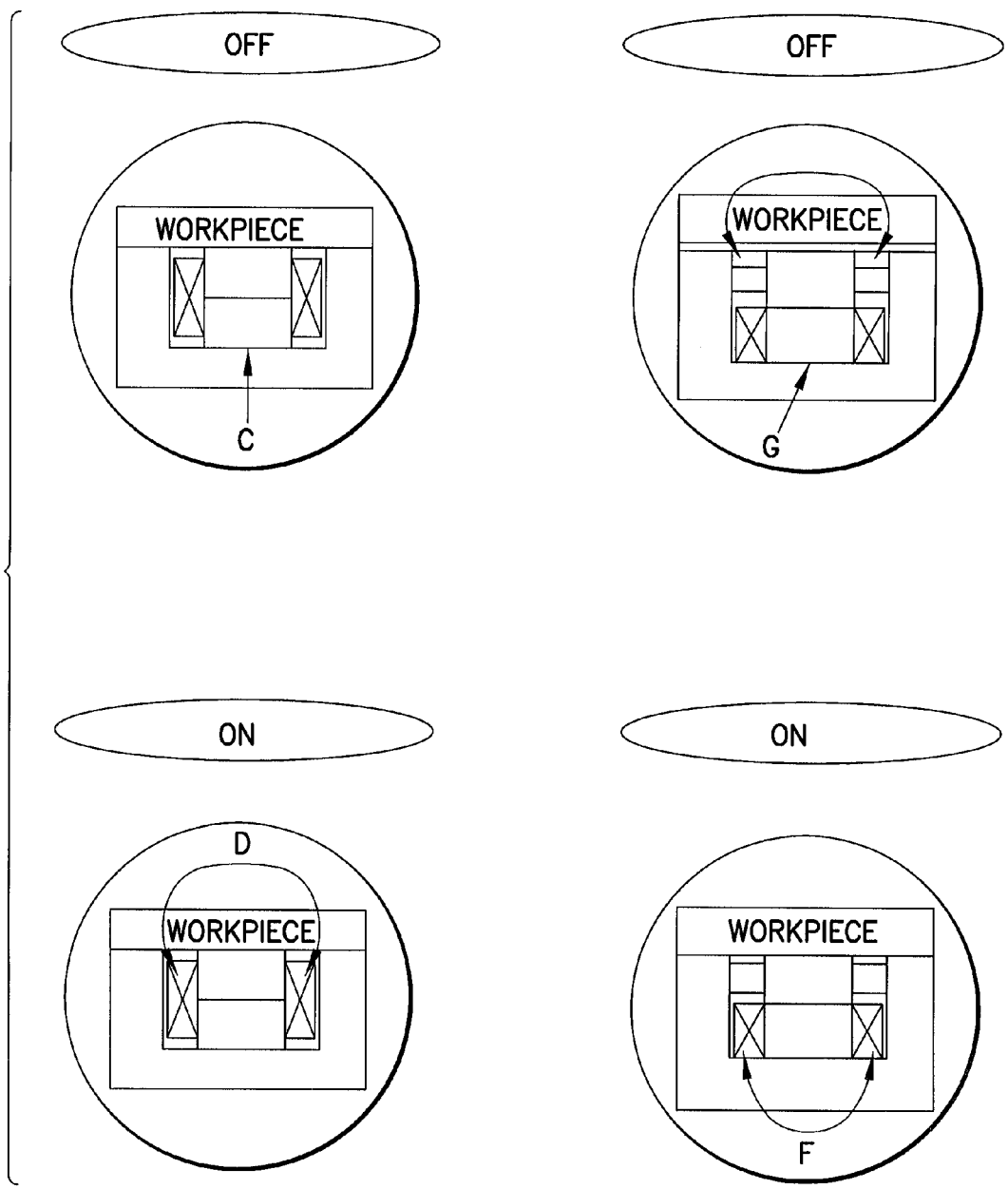
FIG. 17 is a schematic plan view of an exemplary permanent/electromagnetic chuck.

Referring now to FIG. 14, there is shown an elevation view of a carrier C610 registered to the load port LP with a electromagnetic coupling. In this embodiment, the carrier C610 may have suitable magnetic material C616 (such as stainless steel) included in or attached to the carrier casing. The load port be provided with a suitable permanent/electromagnetic chuck LPM. An example of a suitable permanent/electromagnetic chuck is disclosed in FIG. 17, which generally has a permanent magnet or pair of permanent magnets positioned in a coil so that passage of an electric current through the coil switches the chuck on and off. The chuck is activated for carrier retention and deactivated to release the carrier. FIGS. 15A-15C illustrate different exemplary embodiments of the carrier C610A, C610B, C610C with the magnetic material C616A, C616B, C616C in different locations as shown. As may be realized, magnetic retention does not involve moving parts resulting in a very clean interface with substantially no generation of contamination.

Figure 16A:
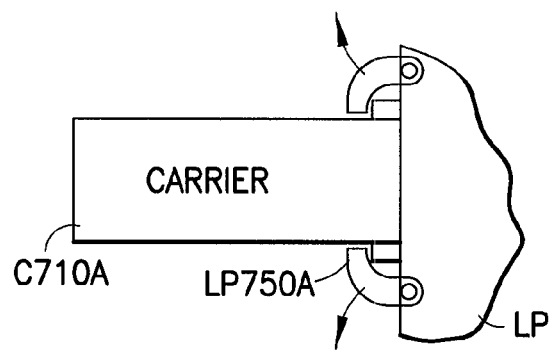
FIGS. 16A-16E are other schematic partial elevation views of active coupling between load port and carrier according to still other exemplary embodiments.
Figure 16B:
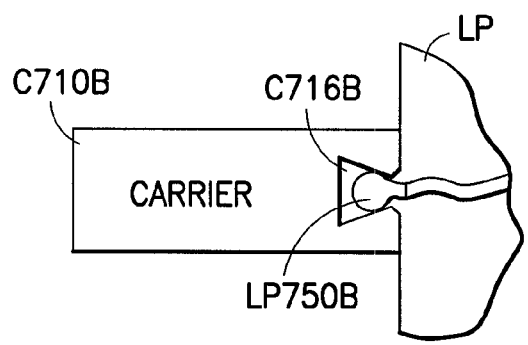
Figure 16C:
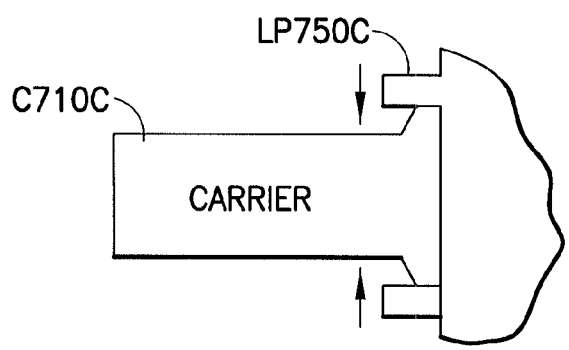
Figure 16D:
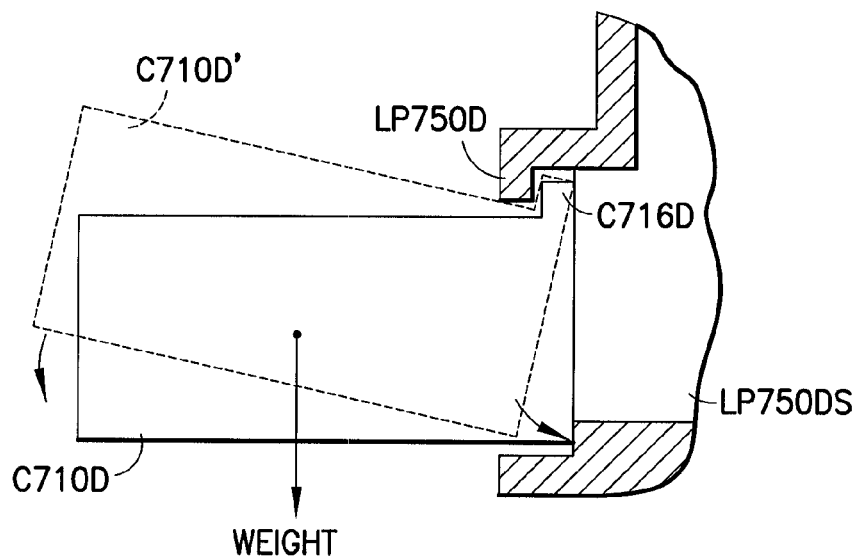
Figure 16E:
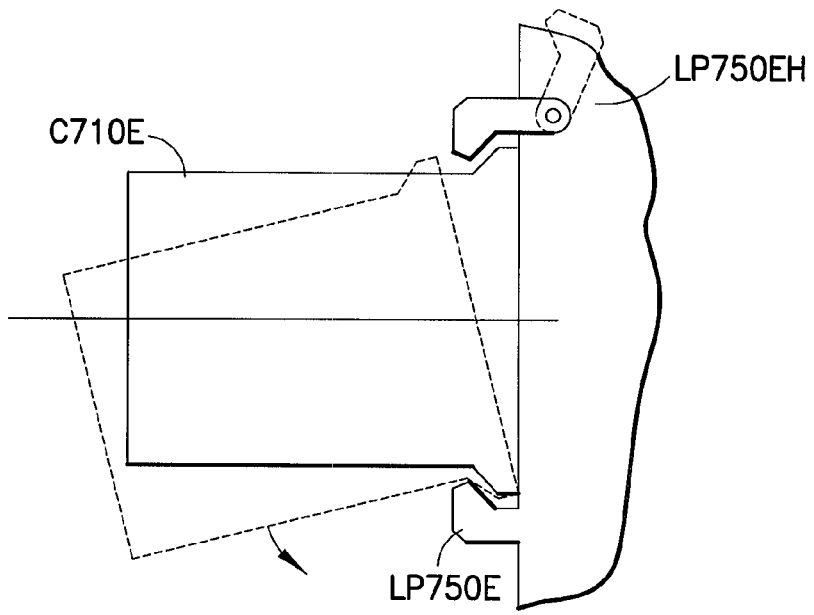

The kinematic coupling between carrier and load port may be an active mechanical coupling (similar to the coupling features illustrated in FIGS. 8A, 8B). Other exemplary embodiments of active mechanical couplings are shown in FIGS. 16A-16E. In FIG. 16A, the load port has rotating clamp section CP750A that engage features on the carrier C710A. In the embodiment shown in FIG. 16B, the load port has an expandable device LP750B (e.g. a bladder) that is admitted into a recess/cavity on the carrier C710B. A suitable source of fluid (not shown) is connected to the bladder via lines provided in the load port docking station. The fluid introduced into the bladder and removed for expansion and contraction is controlled by the host controller. The carrier cavity C716B may have dovetailed faces which engage the surface of the expandable device when the device is expanded inside the cavity to draw the carrier against the load port, and register the carrier in the desired position. In the embodiment shown in FIG. 16C, solenoid operated clamps LP 750C on the load port are moved in an opposing direction against surface of the carrier C710C for registration. FIG. 16 shows another embodiment in which the load port docking station has member LP750OD defining a fulcrum for the carrier C710D and a stop surface LP750DS against which the carrier comes to rest when registered. The carrier has an engagement lip C716D that rests on the fulcrum provided by member LP750D, and the carrier is rotated from entry position C710D' until it rests against stop LP750DS. In the embodiment shown in FIG. 16E, the coupling is arranged in a substantially opposite manner to that shown in FIG. 16, with the fulcrum member LP750E on the bottom, and the carrier C710E rotated up into its registered position. In this embodiment, an active hook LP750EH is movably mounted on the load port to docking station structure engaged and hold the carrier in the registered position.

Upon registration of a carrier at a load port docking station is completed, it may be possible to proceed with opening the carrier to the load port in order to establish a transfer path for substrates between the carrier and tool through the load port. As may be realized, the carrier is opened by removal (or actuation) of the carrier door. Referring again to FIG. 1, in this exemplary embodiment each docking stations 14A-14D of the load port may have a carrier door opener, 14AR-14DR capable of engaging the carrier door, of a carrier registered to the docking station as described above, and of removing the door. In this exemplary embodiment, each carrier door opener may be independently actuated (as will be described in greater detail below) to engage and remove the carrier door so that access to each carrier C docked at a load port docking station may be independently provided. In alternate embodiments, the carrier door openers of to or more docking stations (e.g. carrier door openers similar to openers 14AR-14BR in FIG. 1) may be slaved together to simultaneously engage and open the carrier arms of two or more docked carriers. As may be realized, the carrier door openers on the load port are generally conformal to the configuration of the carrier door to mate, engage and actuate any locking mechanism of the carrier door. For example, if carrier C has a door in accordance with the exemplary embodiment shown in FIG. 5A (i.e. door with holes and slots 22A for door opener pin locating and key engagement arranged pursuant to SEMI standards). The door opener mating interface (not shown) on the load port docking station 14A-14D has locating pins and keys conforming to the mating holes and slots on the carrier door. Another exemplary embodiment of the carrier door opener of a representative load port docking station, similar to docking stations 14A-14D in FIG. 1, is shown in FIG. 10 described previously.

Figure 5B:
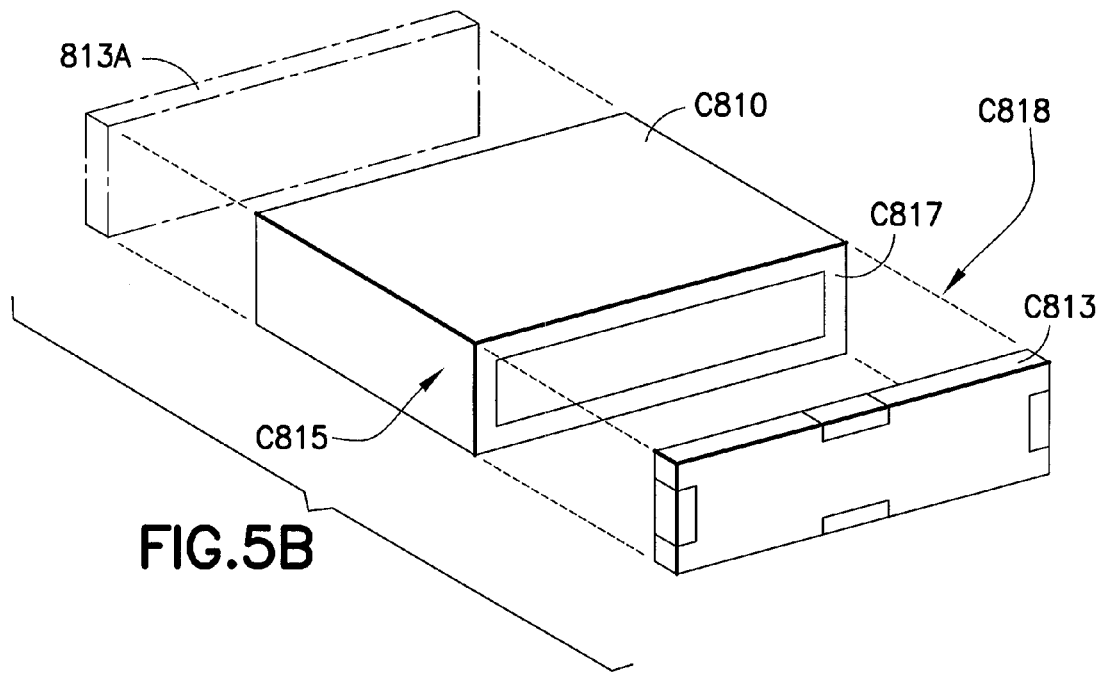
FIGS. 5B-5D are a schematic perspective and partial elevation views of a substrate carrier in accordance with yet other exemplary embodiments.
Figure 5C:
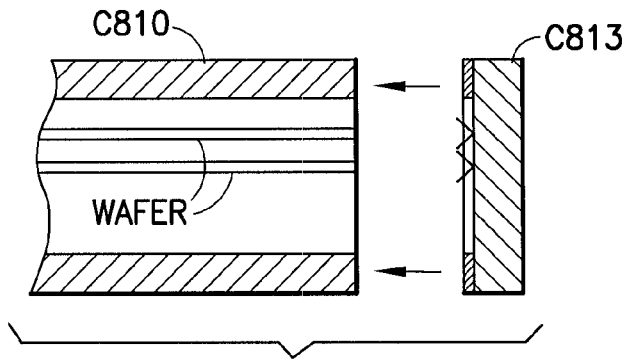
Figure 5D:
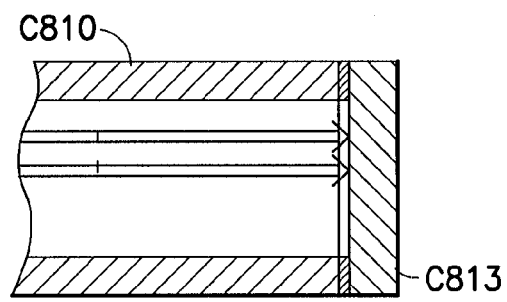
Figure 6:
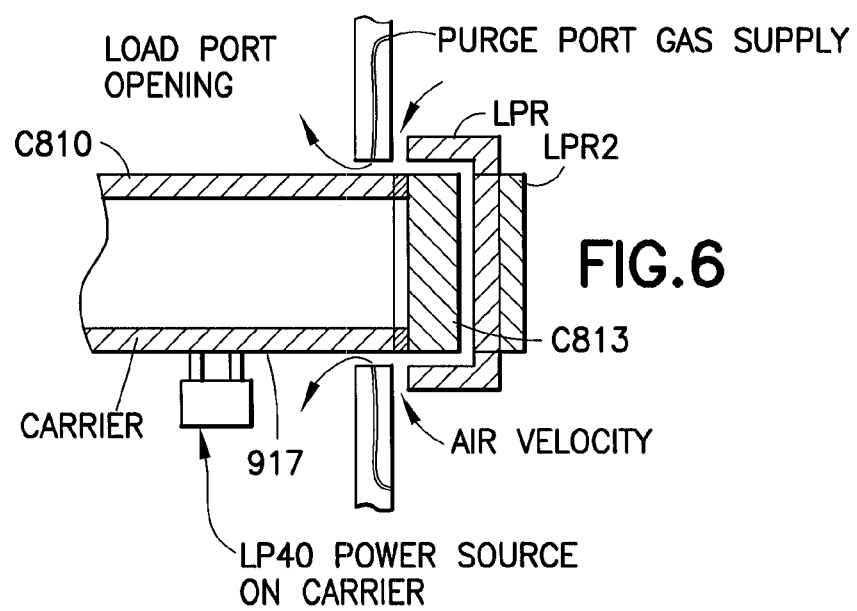
FIG. 6 is a schematic cross sectional view of a load port of the processing system in accordance with one exemplary embodiment interfaced to the substrate carrier shown in FIGS. 5B-5D.

Referring now to FIGS. 5B-5D there is shown a carrier C810 in accordance with yet another exemplary embodiment. In this embodiment, the carrier has a door C813, (another door 813A is shown, in this embodiment, on an opposite side of the carrier allowing the carrier to interface with either side to the docking station or allowing another device to interface with either side opening of the carrier). In alternate embodiments, the carrier may have more or fewer doors. The doors 813, 813A in this embodiment may be secured to the carrier casing with a locking system (C818 with a chuck C815 similar to the permanent/electro-magnetic chuck described before and shown in FIG. 17 acting in the carrier door. In this embodiment the magnetic material may be located in the door C813. The permanent/electro-magnetic chuck C815 may be located in the carrier casing. As noted before, applying a current to the device, for example when the carrier is docked, activates/deactivates the chuck. FIG. 6 illustrates an embodiment in which the load port carrier door opener LPR has a permanent electro-magnetic chuck LPR2 to remove the carrier door C813 from the carrier C810 docked to the load port docking station. Except as otherwise noted, the load port docking station shown in FIG. 6 is similar to docking stations 14A-14D shown in FIG. 1. The permanent electro-magnetic chuck LPR2 in the carrier door is substantially similar to the permanent electromagnetic chuck shown in FIG. 17. Registration of the carrier C810 to the docking station positions the carrier door C813 sufficiently close to the LPR for the chuck LPR2 to capture the door when activated. Seals may be provided to seal the interface between carrier door and door opener LPR as will be described in more detail below. In alternate embodiments, the carrier door may be in contact with the door opener so that activation of the door opener chuck (similar to chuck LPR2) does not cause relative movement between carrier door and door opener. In this exemplary embodiment, activation of the door opener chuck LPR2, as well as the carrier chuck C815, is effected by controller 300 (see FIG. 1) to occur substantially simultaneous with or at some suitable time before the carrier chuck C815 is deactivated. Replacement of the carrier door C813 on the carrier may occur in a substantially similar but reverse manner with the carrier chuck C815 being activated with or prior to deactivation of the carrier door opener chuck LPR2. In the exemplary embodiment shown in FIG. 6, the docking station may have a coupling LP40 for providing power and communication to the registered carrier C810. Although shown as having a mechanical interface (e.g. plug), the carrier coupling may be of any suitable type including wireless RF or optical.

Figure 25A:
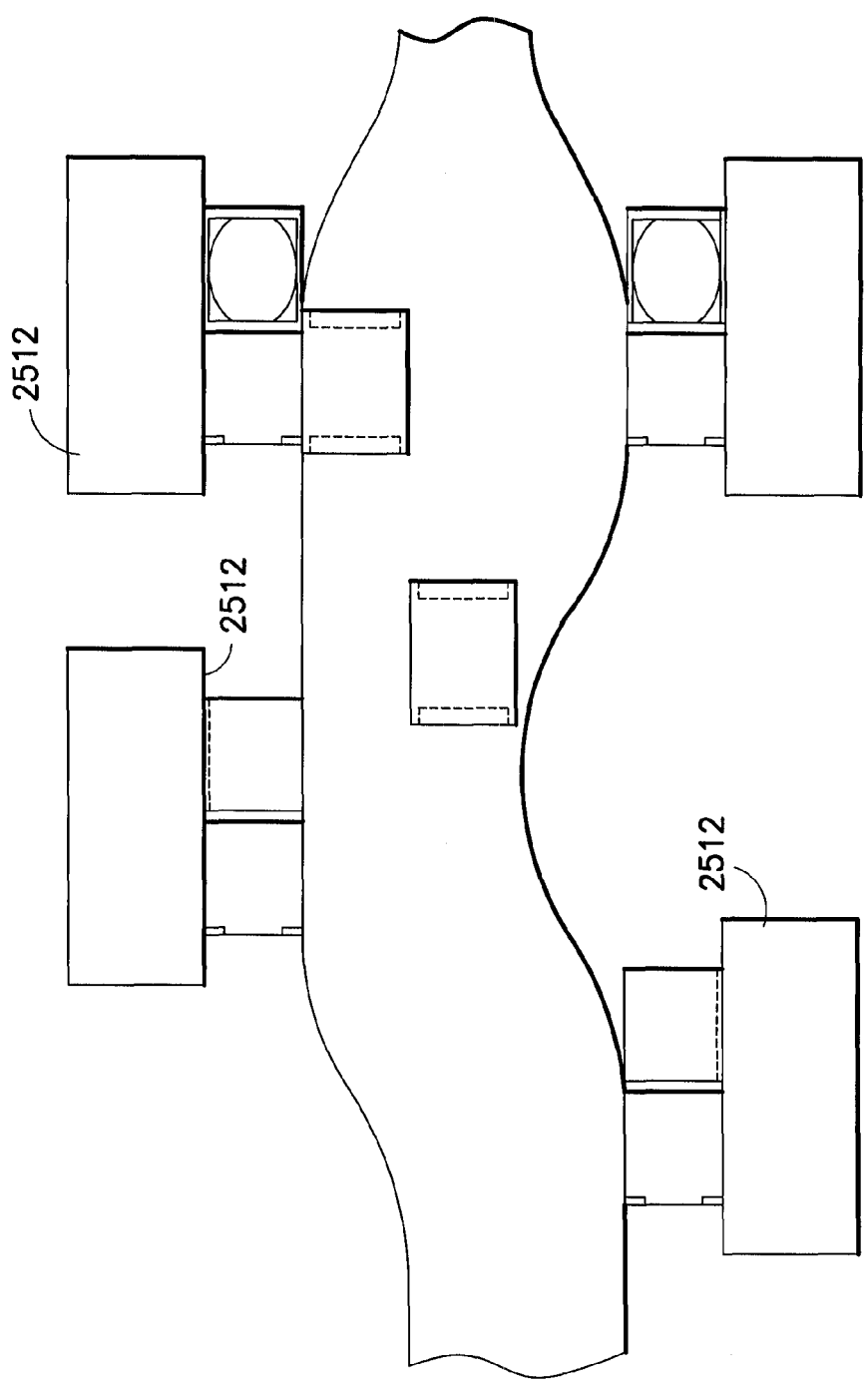
FIGS. 25A-25B are schematic plan and perspective views of processing tools, transport systems, carriers and carrier vehicles according to another exemplary embodiment.

As may be realized, it is highly desired that contamination of either the interior of tool 12 or the interior of the carrier(s) be avoided when the carriers are opened to the tool. Sources of possible contamination to the tool are from outside atmosphere, carrier exterior or carrier interior (as the carrier may be holding a different and undesired gas species, for example a gas species that entered the carrier when opened to a previous tool during the wafer FAB process. Conversely, sources of carrier contamination may be from the outside atmosphere and load port exterior. Referring now to FIG. 18, there is again shown a schematic representative tool 1012 (similar to processing tool 12 in FIG. 1 that has a mini-environment ME provided for the interface between processing modules and substrate carriers C1010. As noted before with reference to tool 12 in FIG. 1, the mini-environment ME may have a controlled atmosphere with a desired gas species/or mix (e.g. N2, AR, AR/02, very dry air that is different from the outside atmosphere. The atmosphere inside the mini-environment may also be different from the atmosphere inside the carrier C1010. The mini-environment is illustrated in this exemplary embodiment as having a load port with a single representative docking station LP1014. The docking station is generally similar to docking stations 14A-14D in FIG. 4. FIG. 18A is a partial cross-sectional view of the load port docking station LP1014 and carrier (1010 registered thereto. In this embodiment, the load port docking station has a carrier door remover LPR that substantially closes the substrate transport opening in the load port. Suitable seals 1116 between load port frame and door remover LPR seal the mini-environment from the exterior. In alternate embodiments, the door remover may not close the load port opening. Also the gas pressure P2 inside the mini-environment may be greater than outside pressure P3 or carrier pressure P4. By sealing the carrier face to the mini-environment, wafer exposure to potentially offensive gas species (e.g. outside atmosphere, undesired gas species from carrier interior) may be controlled as shown in FIG. 18. The sealing may be accomplished with multiple seals (e.g. carrier to carrier door seal 1112, carrier to load port seal 1110, carrier door to load port door remover seal 1114 and load port door remover to load port seal 1116 as shown in FIG. 25A) or a single integrated seal. As noted before, a key (such as may be used with a carrier door as shown in FIG. 5A) may reside in the interface between the carrier and the minienvironment load port docking station, and the carrier C1010 being both (a) front locating and (b) front sealing whereby the locating and engagement action of the carrier also seals the carrier to the load port docking station and hence the mini-environment itself. Trapped air in the interface between carrier and load port may be eliminated by zero-volume sealing (see FIG. 18B which schematically shows the zero volume interfaces between carrier C1010, carrier door C1013, load port door remover LPR and load port LP 1014. Trapped air in the case of the non-zero volume interface shown in FIG. 18A, may be eliminated by purging, such as where a valve is cracked in a purge conduit 1118 of the load port docking station from the minienvironment and the mini-environment gas species introduced into the void VO (defined between door remover LPR and carrier door C108) and evacuated as with an exhaust valve 1120. In the exemplary embodiment, there may be a dedicated purge conduit, though alternatively the purge conduit and valve from the mini-environment may be formed by the seal 1116 between door remover and frame which may be cracked to purge the void VO. The interior region of the carrier 1010 may also be purged, such as for example by exposing the interior of the carrier to the gas species (e.g. cracking seal 1112, first) before the seal 1116 between the port door remover LPR and mini-environment load port LP1014 is opened. Here, when the carrier interior is exposed to the minienvironment, the species that the wafer is exposed to remains the same where the carrier contains that species. In this manner, a carrier may be moved from tool to tool with the gas species that the wafers are being exposed to is effectively controlled. In alternate embodiments, different surfaces may be heated, cooled, charged or otherwise applied to further control particle migration and attraction.

FIGS. 19A-19G show two carriers $C_1$-$C_2$, and carrier door removing mechanisms or representative load port docking stations are show in accordance with a number of exemplary embodiments. Though two carriers and docking stations 14A, 14B are shown, it is understood that these features are applicable to one or more of the docking stations of the load port.

Figure 19A:
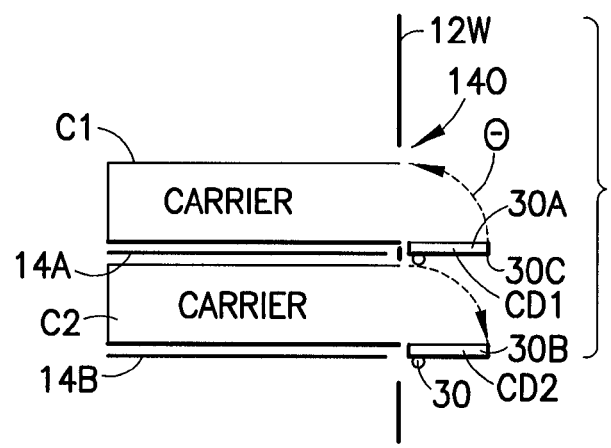
FIGS. 19A-19G are schematic views respectively showing a load port section, carrier/carrier door, and carrier door opener in accordance with different exemplary embodiments.
Figure 19B:
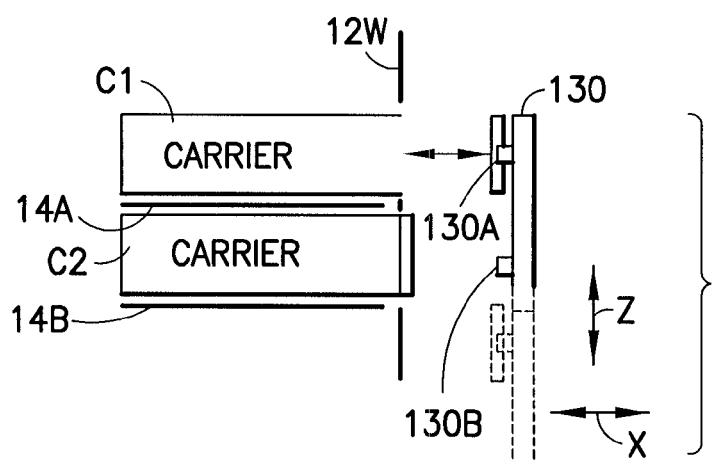
Figure 19C:
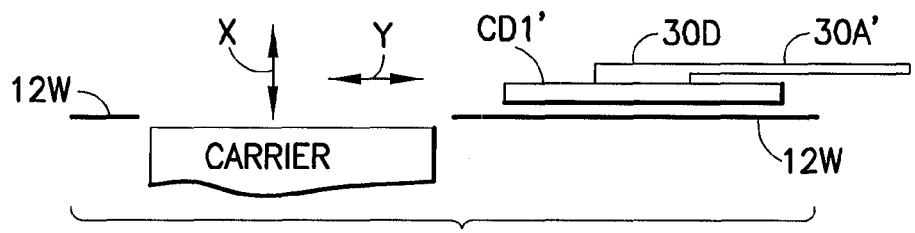
Figure 19D:
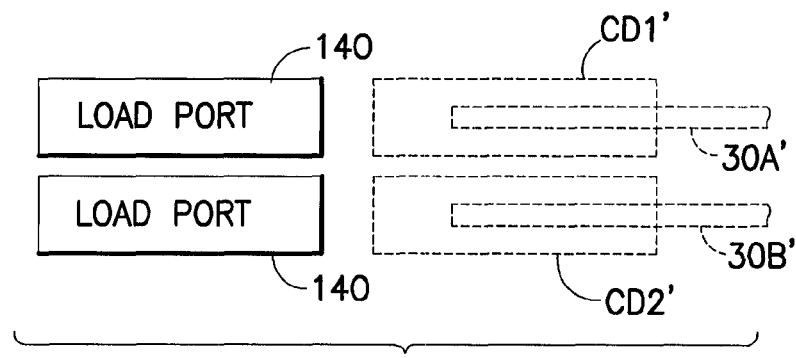
Figure 19E:
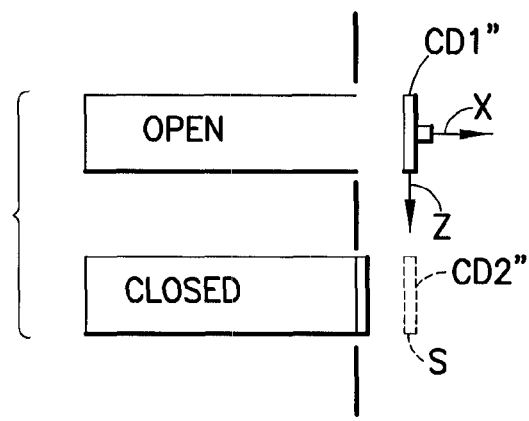

Referring to FIG. 19A, door opening and closing may be accomplished by using 1 to n mechanisms, similar to mechanisms 30A, 30B where n is the number of docking stations per loadport. Deploying one door opener 30A, 30B at every docking station 14A, 14B permits complete flexibility in the wafer access sequence. This is shown in FIG. 19A. In this embodiment, each door opening and closing mechanism 30A, 30B may service a specific carrier $C_1$-$C_2$ at a corresponding loadport docking station. Door opener mechanisms 30A, 30B are substantially similar. Each door opener mechanism 30A, 30B may have interlock and engagement features, such as locator pins, engagement keys, to mate with the doors CD1, CD2 of the carriers. As seen in FIG. 19A, the door opener mechanism may include a closure 30C capable of closing or at least partially blocking the loadport interface opening 140. The door opener mechanism 30A, 30B is actuable as will be described, from a blocking position (not shown) to an open position shown in FIG. 19A. When in the blocking position, the door mechanism is able to engage the carrier door CD1, CD2 with the engagement features. Further, the engagement features are operable, such as by, servomotor, or pneumatic actuator, to cause release as well as engagement of the locks (not shown) holding the door CD1 on the carrier. The engagement features, may also be operable to engage or lock the carrier door CD1 to the door opener mechanism 30A, or dedicated locks (e.g. vacuum) may be provided to hold the carrier door onto the door mechanism. Each door opener mechanism 30A, 30B may have a suitable actuator 30, such as a motor or pneumatic actuator for independently moving each door opener mechanism 30A, 30B between blocking and open positions. As may be realized, in the open position, the door opener mechanism provides substantially unrestricted access for transport of substrates to and from the carrier through the load port. In the exemplary embodiment shown in FIG. 19A, the carrier door CD1 is pivoted, such as for example on a hinge, through an arc θ between blocking and open positions. FIGS. 19C-19D, which respectively are schematic top plan and front elevation views of door openers of load port docking stations in accordance with another exemplary embodiment. In this exemplary embodiment, each carrier door CD1, CD2 is translated by corresponding door opener mechanisms 30A', 30B' in a plane, defined by directions indicated by arrows X and Y. As seen in FIGS. 19C-19D, the door openers 30A', 30B' in this embodiment are connected to a suitable actuation mechanism (such as pneumatic or electric drive) capable of generating the substantially linear motions of the door openers in the directions indicated by arrows X, Y in FIG. 19C. As may be realized, direction X is oriented out of plane with respect to the face plane 12W of the load port (defining the load port opening). The Y direction is oriented laterally along the load port face plane 12W. The movement directions X, Y may not be respectively orthogonal or parallel to the face plane, and may not be orthogonal relative to each other. As in the embodiment illustrated in FIG. 19A, and as shown in FIGS. 19C-19D, the door openers may be actuated independently of each other, and the movement paths of the door openers and hence of the carrier doors CD1' CD2', between open and closed positions do not lapse interference between either the door remover or carrier door and substrate transport paths through the substrate loading openings 140 of other load port docking stations. Thus, in this embodiment access to each carrier at a docking station may be independently provided.

Figure 19F:
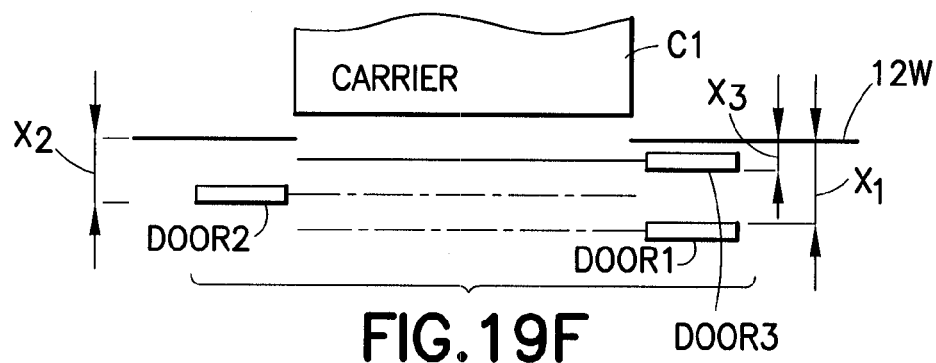
Figure 19G:
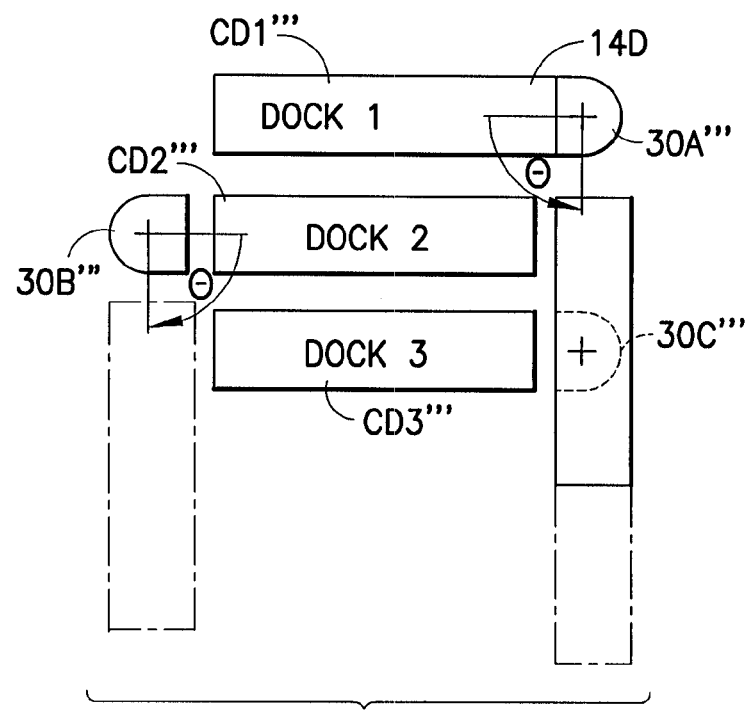

In FIGS. 19F-19G, each door CD1''', CD2''', CD3''' is pivoted by the door opener mechanism 30A''', 30B''', 30C''' within a plane substantially parallel to the backplane 12w of the loadport. In this exemplary embodiment, the respective door opener mechanism 30A''', 30B''', 30C''' may be positioned on opposite sides of the loadport opening 140 as shown. Each opener mechanism pivots the corresponding doors CD1''', CD2''', CD3''' in opposite directions (mechanisms 30A, 30C rotate counterclockwise and mechanism 30B rotates clockwise). In alternate embodiments, both mechanisms may rotate the doors in the same direction. In this embodiment, the door opener mechanism may displace the door by translation in the direction indicated by arrows X1, X2, X3 to a position where the doors may be freely rotated so as not to interfere with each other. In the exemplary embodiment shown in FIG. 19E, the door opener mechanism is capable of moving the door CD1'' from the blocking position to a location S in front of a closed carrier, or a loadport opening where no carrier is located.

In alternate embodiments a reduced number of door remover mechanisms (i.e., fewer mechanism than openings) may be employed, each capable of performing door opening and closing at one or more dock positions. The exemplary embodiment of the tool station illustrated in FIG. 19B deploys a single mechanism 130 at each loadport 14 (see FIG. 1) that can selectively engage 1 to n carrier doors such that any combination may be opened and/or closed simultaneously. In this case, the mechanism 130 has multiple door engagement stations with features for engaging carrier doors. The features 130A, 130B may be selectably operated to lock or unlock carrier doors (e.g. simultaneously lock and unlock different doors, or lock/unlock doors while other doors are not engaged).

It is envisioned that the door removal process may be similar to the process currently used to remove a standard 13 or 25 substrate FOUP. However, other door opening mechanisms and methods are disclosed. For example, the carrier door may swing open from top to bottom exposing the substrates to a robotic manipulator. The mechanism may have to unlatch a door-closing latch and rotate the door down to open the carrier and rotate the door up and latch the door-closing latch to close the carrier. Additionally, the doors may be blocked by sealed balloon interface in which the opening and closing mechanism may be controlled by a gas delivery and removal system that blows up the balloon seal to close the carrier and evacuates the gas to open the carrier.

A consequence of deploying reduced wafer-count carriers is an increase in the total quantity of carriers, and in the frequency of docking/undocking events throughout the factory. As such, the overall complexity of the control software for the tool buffer system is significantly increased. Additionally, the resulting increase in demand for communication with factory control software (particularly the downloading of recipes and parameters) is accompanied by an increased sensitivity to communication latency, since the process time per carrier is similarly reduced. To ensure that wafer processing is not delayed, instructions can be dispatched to the tool in advance of the carrier and verified upon its arrival. To accommodate such a scheme, the carriers C in the exemplary embodiments may be considered "smart" carriers which contain on-board intelligence, such as a processor or memory module (not shown), that carry such information for the current tool and, possibly, future process steps. Hardware such as controller 300 (see FIG. 1) is deployed throughout the system to read and write such data to and from the carrier. Communication time is decoupled from transfer time by replacing a serial data exchange with a single time-critical transfer of information (e.g., between carrier and tool) preceded and followed by background updates to the host.

Figures 23A, 23B:
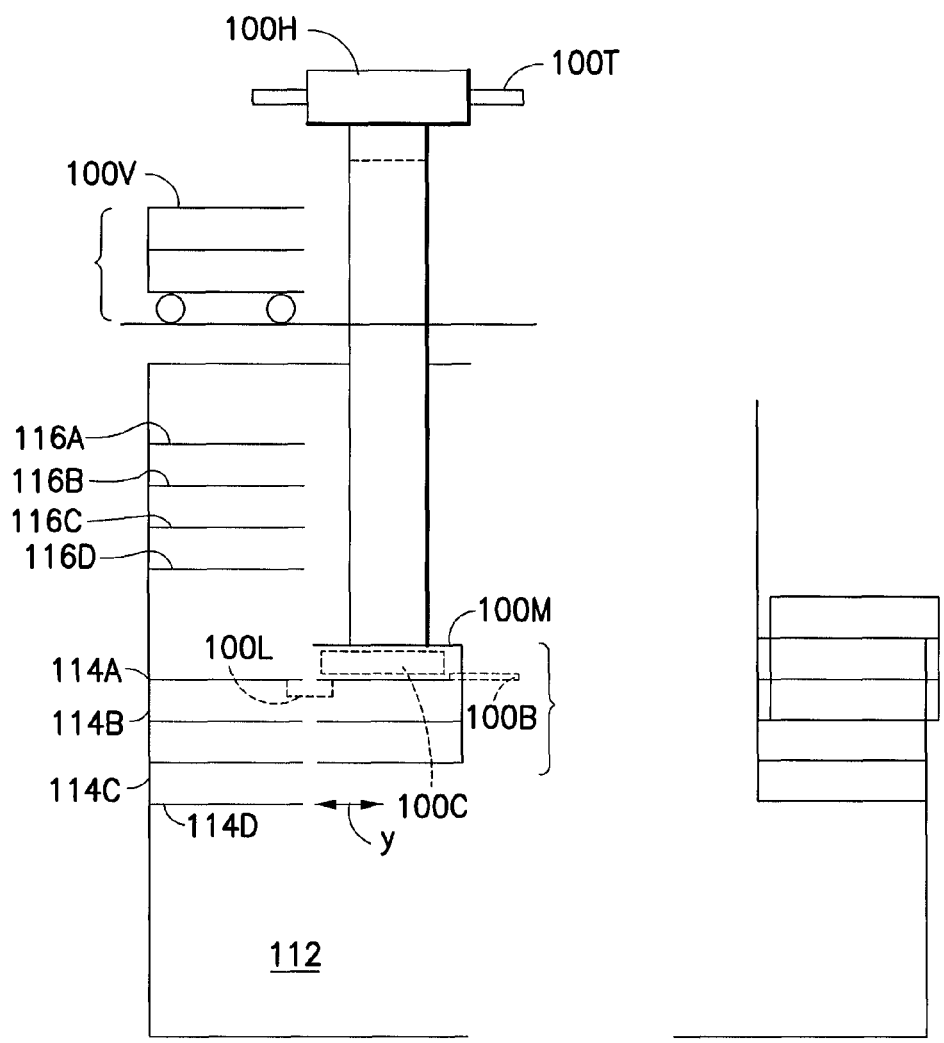
FIGS. 23A-23B are schematic elevation views, as seen from different directions, of processing tool, carrier holding station and transport systems in accordance with another exemplary embodiment.

Referring to FIGS. 23A-23B, there is shown a schematic front and side elevation views of tool station 112 and overhead transport system 100T in accordance with yet another exemplary embodiment. As seen in FIGS. 23A-23B, tool station 112 is substantially similar to the above-described tool station 12 but utilizing an overhead hoist 100T, rather than an elevator 20, to effect the vertical translation of the carriers. The loading hoists may be affixed to over head track vehicles 100V as part of the transportation system, or alternatively as part of a "gantry" crane system 100T dedicated to servicing one or more tools. In the latter embodiment, hoists may be added as desired to provide redundancy and match demand.

FIG. 23A shows a carrier magazine 100C that is raised and lowered by an overhead hoist 100H to interface with docking stations 114A-114D, buffer locations 116A-116B, and the transportation system 100T. A novel approach is desired to manage the reaction forces arising from transverse (indicated by arrow Y) carrier motion at the end of a flexible hoist. In this exemplary embodiment the carrier magazine 100M is docked to the loadport docks 114A-114D with a mechanical latch, magnetic attraction, or fluid pressure or other actuable supporting system 100L (shown schematically in FIG. 23A). The latching means 100L provides the support to offset the reaction forces that arise while a carrier is transported to/from the lifting magazine 100M and the load port docking stations 114A-114D (in a similar manner the carrier magazine may be stably held for lateral carrier transport to the buffer location supports 116A-116B). Alternatively, a counteracting force could be generated by a moving mass 100B or gyroscope to compensate for the lateral motion applied to the lifting magazine during the carrier transport. In yet other alternate embodiments the flexible hoist may be replaced with substantially rigid reeled members. The rigid members from the hoist to the lifting magazine offset the reaction forces that arise while a carrier is transported to/from the lifting magazine and the load port docking stations.

Figure 24A:
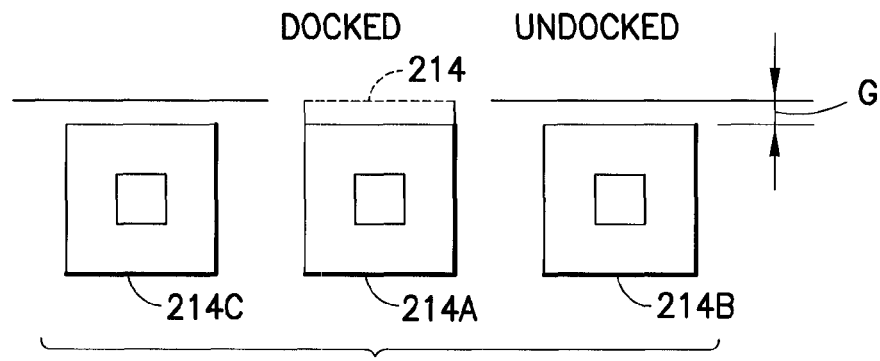
FIGS. 24A-24C are respectively schematic top plane view, side elevation view of the processing tool load port section in FIG. 23A and substrate carriers shown in different positions.
Figure 24B:
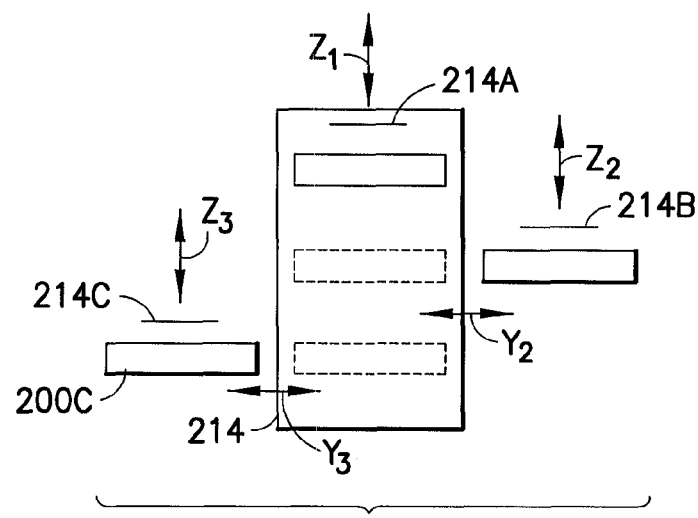
Figure 24C:
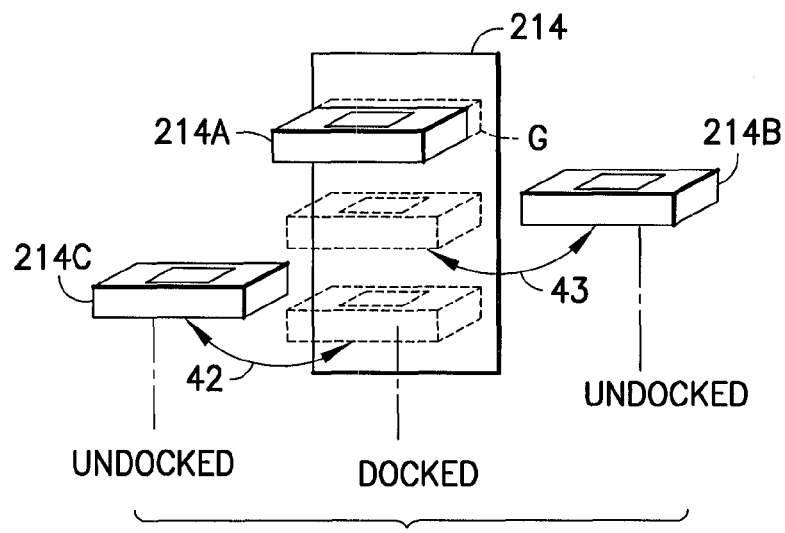

Another way the exemplary embodiment enables hoist-based loading is to make all docking positions accessible from above. Referring to FIGS. 24A-24C, there is shown a loadport 214 with multiple docking levels (shelves) 214A-214C capable of presenting carriers for access from directly overhead as indicated respectively by arrows Z1-Z3. Loadports may have an "undocked" position where carriers are loaded and unloaded, offset by gap G, and a "docked" position, where wafers are accessed (FIGS. 24A, 24C). In all (e.g. dock positions 214B-214C) but the topmost dock position 214A, a swing-out motion indicated by reference arrows 42, 43 move carriers from the docked to the undocked position providing top access. The loadport docking shelves 214B, 214C rotate or horizontally traverse Y2, Y3 to a position in which the OHT can delivery a carrier. After the carrier 200C is place onto the docking shelf 214C-214B, the shelf may be rotated or horizontally traversed within the loadport opening boundary. In one embodiment, the hoist has a mechanism such as previously described that allows for a swap of a processed carrier with an unprocessed carrier.

If additional storage of carriers is desired (i.e., bulk factory storage, as distinct from local tool buffering), the loading system described above could be deployed remotely with extra buffer positions replacing the loadport. The buffer positions may be stand-alone racks that may be secured from the floor, ceiling, or attached to a process tool. Buffer positions may also be racks that are located directly below or attached to the side of a transport system track.

In accordance with another exemplary embodiment, the load port(s) such as load port 14 in FIG. 1), the buffer (e.g. buffer 16 in FIG. 1) and handling system 20 (e.g. handling system 20 in FIG. 1) may be modular. FIGS. 20A-20C shows front views of three exemplary arrangements of load port modules 2014, buffer modules 2016 and handling system modules 2020. Except as otherwise noted the load port modules 2014, buffer modules 2016 and handling system module are substantially similar to the load port 14, buffer 16 and handling system 20 described before and shown in FIG. 1. FIG. 20A shows load port and buffers modules to the left (facing out from tool BOLTS plane) of the handling system module. In alternate embodiments the arrangement may be mirror opposite to that shown in FIG. 20A. Also buffers may just be located above or just below the load port. FIGS. 9B and 9C also show load port modules 2014 and buffer modules 2016U, 2016B located on both sides of the handling module 2020. In alternate embodiments, the load port module may be on one side and the buffer module on the other side of the handling module. The modules 2014, 2016U, 2016B, 2020 may be related to each other at the module interface 2022X. The module interface 2022X defines where each module is mounted and registered so that each module is related to another module by reference to a suitable interface datum 2026 (e.g. the FAB floor or other suitable datum). The handling module may also be registered relative to a payload transport system 2006 (similar to transport system 6 in FIG. 1) located at any elevation between the floor and ceiling of the installation. The modules may be assembled in any desired order. One exemplary method to attach the modules may be that the load port module 2014 may be mounted to the BOLTS plane of a tool, (see FIG. 9D, the handling module 2020 to the load port module and the buffer modules 2016V, 2016B to the handling module 2020. In accordance with another exemplary embodiment, the modules may be pre-assembled to each other then mounted as an assembly 2024 to the BOLTS plane. Once in the FAB, any module may be changed to accommodate a change in the operational parameters of the system. The Interface datum 2026 may be used for "factory" teaching of the handling system of module 2020 and controller 300. All modules are individually configurable for accommodating any of a number of predetermined payloads that conform to different operating scenarios. These differences might be in the vertical pitch of payloads at load port docking stations or buffer locations or the reach of the payload manipulator (not shown) mounted to the handling system. The manipulator might also employ a different "end-effector" to accommodate the particular payload. The end effector could be a paddle, a fork, a mechanical gripper, magnetic chuck, or any such device particular to its purpose. Since variable configurations are possible, the handling system module may be self teaching relative to the interface datum. Once a configuration of modules is assembled into a system, an instruction given to the controller 300 by means of a suitable interface (touch screen or equal) may cause the handling system to run through a self teaching routine that establishes the desired positioning and sequencing for the system configuration. This may be achieved in numerous ways such as by the application of a routine that uses sensors such as photo-electric types to determine the particular relationship of modules. Once this relational information is collected, pre-taught routines existing in the controller may take over for the manipulation of payload within the system.

Referring now to FIGS. 21A-21B there is shown plan and elevation views of tools or tool stations 2012, 2012' connected by a shunt transport system or shunt 2004 in accordance with another exemplary embodiment. The tool stations 2012, 2012' are similar generally to each other and to tool station 12 in FIG. 1. Each tool station 2012, 2012' may have buffer 2016V, 2016V' load port 2014, 2014' and handling system 2020, 2020'. As may be realized, the arrangement of the buffer, load port and handling system may be different at each tool station. The shunt may be arranged to connect two or more tool stations 2012, 2012' and in particular two or more systems of the connected stations. For example, the shunt may connect the buffer of one tool station to the buffer, load port and or handling system or another tool station, and vice versa. The shunt may interconnect stations at any number of tool stations in any desired combinations. The shunt 2004 may be a dedicated unidirectional or bi-directional carrier transfer device such as a section of accumulating conveyor. Alternately, the shunt 2004 may be provided by any vehicle- or conveyor-based transport device (including overhead transports OHT's) deployed in parallel with the main carrier transport system between and among any number of tools. FIG. 21B shows one buffer level connection however multiple levels may be connected. The shunt 2004 may also register to the aforementioned interface datum (see FIG. 20B) of each tool station for self teaching purposes.

Figure 22:
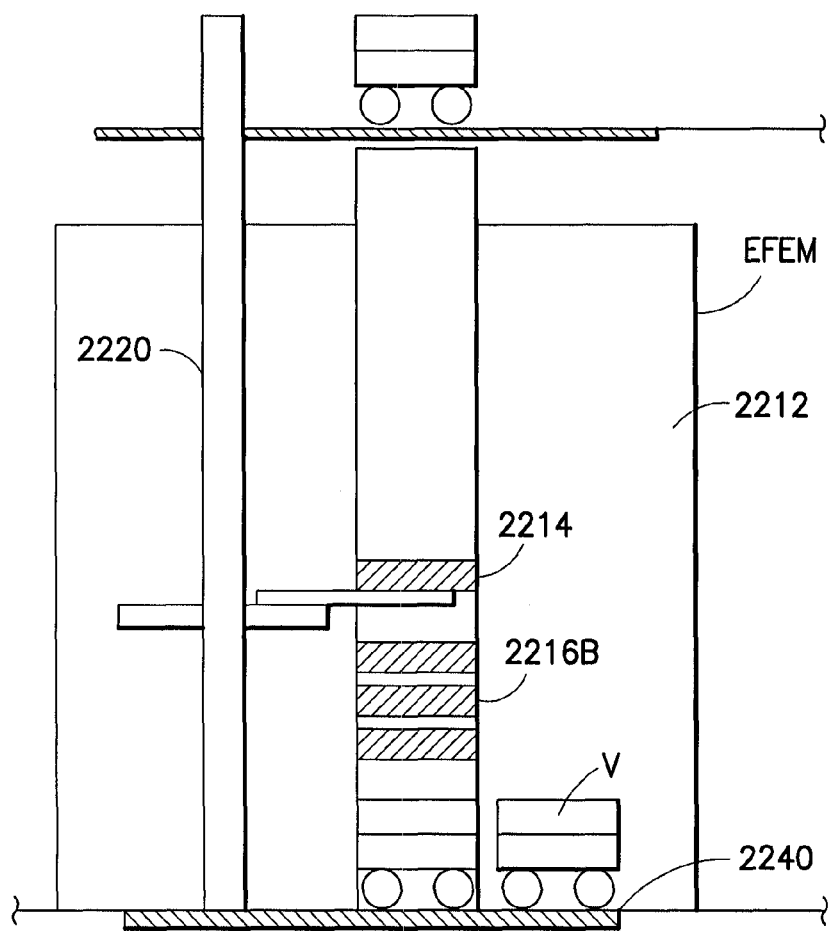
FIG. 22 is a schematic elevation view of a processing tool, transport systems, transport vehicles and vehicle charge station according to another exemplary embodiment.

FIG. 22 shows another tool station 2212 (with the load port 2014, buffer 2016B) and transport vehicles in position for loading, unloading, or queued for access to handling system 2220. Vehicles powered by stored energy (batteries and/or ultra-capacitors) will recharge at charging zones 2240 within the space envelope of the buffer/load port or handling system at the tool station. The charging may be accomplished by contact or non-contact (inductive) means from below, above, or beside the vehicle as well as upstream or downstream of that point. The charging zone may be located as desired so that vehicles V may charge while queued, unloading, or loading, making use of internal processing time. Vehicle charging in these locations will not interfere with other vehicle traffic. Charging power supplies and electronics (not shown) may be packaged in modular form to allow installation as a module in the desired location.

Figure 25B:
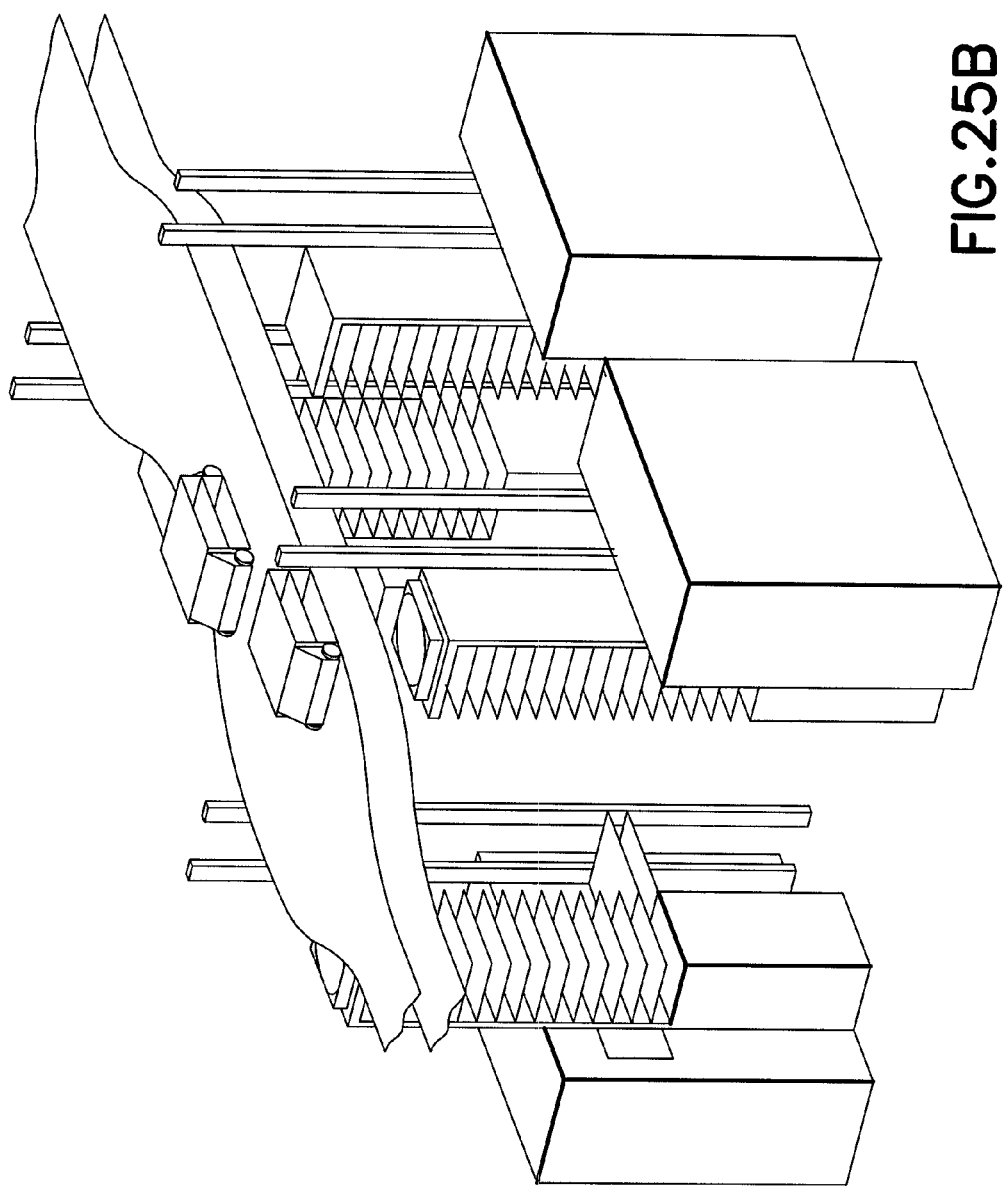

FIG. 25A shows an example plan view of a FAB layout with tool stations 2512 substantially similar to tool station 12, 12' described before and shown in FIGS. 1, 2A-2B. In this embodiment, the load port buffer, and elevator may be located in front of the tool station and occupy, for example approximately 18 inches of space in an aisle. FIG. 26A shows a plan view layout of another exemplary embodiment that reorients the load port 2614, buffer 2616 and elevator 2620 of the tool 2612 to the side of the tool station, allowing reduction of the aisle width by the depth of the load-port; (e.g. about 18 inches per side; in a dual aisle a total of about 36 inch. In this embodiment, the load port, buffer and handling system are in line with the tool. The load port and buffer is interposed between tool and handling system. If a front opening carrier C is used in this layout the payload may be reoriented so that the carrier C13 door faced the side of the EFEM. In this layout access for manual loading of a tool may be done from the tool chase area leaving the aisles free for low elevation vehicle traffic, free of operator interference. As shown in FIG. 26A a vehicle V will carry its payload (e.g. carrier C) in the proper orientation. FIGS. 25B and 26B are isometric views of each layout described.

Figure 28B:
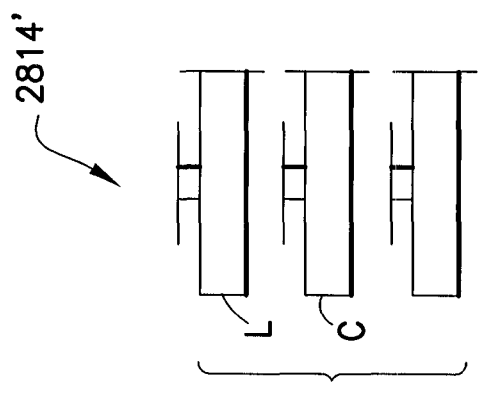
FIGS. 28A-28B are schematic elevation views from different directions of front end section of a processing tool and carriers according to other exemplary embodiments.
Figure 28A:
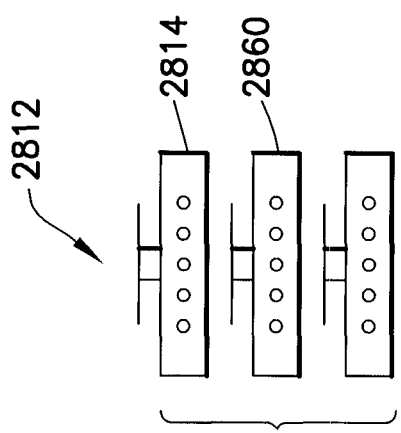
Figure 27:
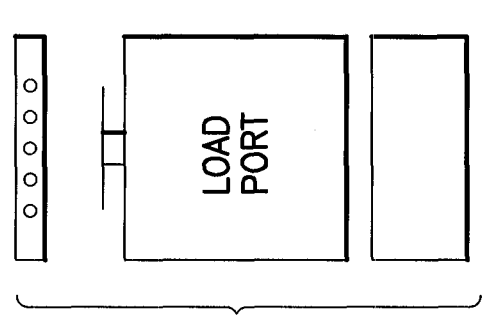
FIG. 27 is a schematic elevation view of a front end section, of a processing tool and carrier according to the prior art.

As shown in FIG. 28A, load port 2814 of tool station 2812 may have port status indicators 2860, such as LEDs, may be incorporated on loadport modules to display port states including carrier present, carrier nested, busy, ready, and the like. FIG. 28B shows an arrangement in accordance with another exemplary embodiment whereby the status indication resides on the carrier C itself, rather than the loadport module 2814. The status may be generated locally (e.g., sensors that detect proper nesting reside within the carrier) or transmitted to the carrier from the loadport as with wireless transmission, or mechanical coupling. Similarly, power to illuminate the display may be supplied by the loadport or stored as electrical energy within the carrier. FIG. 27 illustrates status indicator of a convention EFEM.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

The invention claimed is:
1. A substrate processing apparatus comprising:
a casing with a processing device within for processing substrates;
a load port interface connected to the casing for loading substrates into the processing device;
a carrier holding station connected to the casing, the carrier holding station being adapted for holding at least one substrate transport carrier at the load port interface; and
a carrier loading and buffering system having a transport configured to interface with the carrier holding station for loading and unloading the at least one substrate transport carrier from the carrier holding station, wherein the transport of the carrier loading and buffering system is further configured to interface with a first carrier transport system, capable of moving the at least one substrate transport carrier from the substrate processing apparatus to another substrate processing apparatus along a first transport path, and with a second carrier transport system, distinct from the first carrier transport system, capable of moving the at least one substrate transport carrier from the substrate processing apparatus to the other substrate processing apparatus along a second transport path where the carrier loading and buffering system is distinct from the first and second carrier transport systems.

2. The apparatus according to claim 1, wherein the first and second carrier transport systems are offset relative to each other.

3. The apparatus according to claim 1, wherein the loading and buffering system spans between the first and second carrier transport systems joining the first and second carrier transport systems to each other.

4. The apparatus according to claim 1, wherein the carrier loading and buffering system has storage stations, each of which is configured for storing the at least one substrate transport carrier, and the carrier loading and buffering system has a carrier transfer interface where the carrier loading and buffering system interfaces with the first carrier transport system and the second carrier transport system for transferring the at least one substrate transport carrier between the carrier loading and buffering system and the first carrier transport system and second carrier transport system, and wherein the carrier transfer interface is distinct and independent from each of the storage stations.

5. The apparatus according to claim 1, wherein the carrier loading and buffering system has storage stations, each of which is configured for storing the at least one substrate transport carrier, and the carrier loading and buffering system has a carrier transfer interface where the carrier loading and buffering system interfaces with the first carrier transport system and the second carrier transport system for transferring the at least one substrate transport carrier between the carrier loading and buffering system and the first carrier transport system and second carrier transport system, and wherein the carrier transfer interface is not one of the storage stations of the carrier loading and buffering system.

* * * * *